United States Patent
Lee et al.

(10) Patent No.: US 11,062,945 B2
(45) Date of Patent: Jul. 13, 2021

(54) METHODS FOR REDUCING CONTACT DEPTH VARIATION IN SEMICONDUCTOR FABRICATION

(71) Applicant: Taiwan Semiconductor Manufacturing Co., Ltd., Hsinchu (TW)

(72) Inventors: Yun Lee, Taipei County (TW); Chen-Ming Lee, Taoyuan County (TW); Fu-Kai Yang, Hsinchu (TW); Yi-Jyun Huang, New Taipei (TW); Sheng-Hsiung Wang, Hsinchu County (TW); Mei-Yun Wang, Hsin-chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/201,282

(22) Filed: Nov. 27, 2018

(65) Prior Publication Data
US 2019/0096760 A1 Mar. 28, 2019

Related U.S. Application Data

(62) Division of application No. 15/690,709, filed on Aug. 30, 2017, now Pat. No. 10,685,880.

(51) Int. Cl.
*H01L 29/417* (2006.01)
*H01L 21/768* (2006.01)
*H01L 29/66* (2006.01)
*H01L 21/3105* (2006.01)
*H01L 21/02* (2006.01)
*H01L 21/311* (2006.01)
(Continued)

(52) U.S. Cl.
CPC .... *H01L 21/76895* (2013.01); *H01L 21/0217* (2013.01); *H01L 21/31053* (2013.01); *H01L 21/31111* (2013.01); *H01L 21/76805* (2013.01); *H01L 21/76826* (2013.01); *H01L 21/76831* (2013.01); *H01L 21/76832* (2013.01); *H01L 23/535* (2013.01); *H01L 29/0649* (2013.01); *H01L 29/41791* (2013.01); *H01L 29/66795* (2013.01); *H01L 29/7851* (2013.01)

(58) Field of Classification Search
CPC ................................................. H01L 29/41791
USPC ........................................................ 438/675
See application file for complete search history.

(56) References Cited

U.S. PATENT DOCUMENTS 8,765,546 B1 7/2014 Hung et al.
8,772,109 B2 7/2014 Colinge
(Continued)

*Primary Examiner* — Hsin Yi Hsieh
(74) *Attorney, Agent, or Firm* — Haynes and Boone, LLP

(57) ABSTRACT

A method includes providing a device structure having an isolation structure, a fin adjacent the isolation structure and taller than the isolation structure, and gate structures over the fin and the isolation structure. The isolation structure, the fin, and the gate structures define a first trench over the fin and a second trench over the isolation structure. The method further includes forming a first contact etch stop layer (CESL) over the gate structures, the fin, and the isolation structure; depositing a first inter-layer dielectric (ILD) layer over the first CESL and filling in the first and second trenches; and recessing the first ILD layer such that the first ILD layer in the first trench is removed and the first ILD layer in the second trench is recessed to a level that is about even with a top surface of the fin.

15 Claims, 20 Drawing Sheets

(51) Int. Cl.
*H01L 23/535* (2006.01)
*H01L 29/06* (2006.01)
*H01L 29/78* (2006.01)

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,299,803 B2 | 3/2016 | Tsai et al. |
| 9,520,482 B1 | 12/2016 | Chang et al. |
| 9,576,814 B2 | 2/2017 | Wu et al. |
| 9,633,999 B1 | 4/2017 | Lu et al. |
| 2005/0020020 A1 | 1/2005 | Collaert et al. |
| 2011/0227162 A1 | 9/2011 | Lin et al. |
| 2013/0187206 A1 | 7/2013 | Mor et al. |
| 2014/0327080 A1* | 11/2014 | Hung ............... H01L 21/76895 257/365 |
| 2015/0021710 A1 | 1/2015 | Hsu et al. |
| 2015/0364559 A1 | 12/2015 | Wang |
| 2016/0064327 A1 | 3/2016 | Lin et al. |
| 2016/0104646 A1 | 4/2016 | Hung et al. |
| 2016/0336429 A1 | 11/2016 | Peng et al. |
| 2017/0186849 A1 | 6/2017 | Chen et al. |

\* cited by examiner

US 11,062,945 B2

METHODS FOR REDUCING CONTACT DEPTH VARIATION IN SEMICONDUCTOR FABRICATION

PRIORITY DATA

The present application is a divisional application of U.S. patent application Ser. No. 15/690,709, entitled "Methods for Reducing Contact Depth Variation in Semiconductor Fabrication," filed Aug. 30, 2017, which is herein incorporated by reference in its entirety.

BACKGROUND

FINFET devices have become a mainstream in semiconductor fabrication to achieve ever smaller device features and increased circuit performance. There are many challenges in fabricating these small FINFET devices in an integrated circuit (IC). For example, when forming contact features in FINFET devices, contact depth variation has become a problem due to the topography on the wafer. Particularly, semiconductor fins are usually taller than isolation structures that insulate the fins. When contact features (comprising metal(s)) are formed on top of the fins as well as on the isolation structures, some of the contact features are taller than others. Over time, these uneven contact features may tilt and push nearby circuit elements (e.g., gate structures) to bend, which might cause circuit defects. Another issue associated with contact formation is that some contact holes are deep and narrow and it may be difficult for the contact features to completely fill these contact holes, leaving voids under the contact features. These voids may be difficult to detect during the manufacturing stage, but they may cause circuit short or open over time. Accordingly, improvements in contact formation process are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
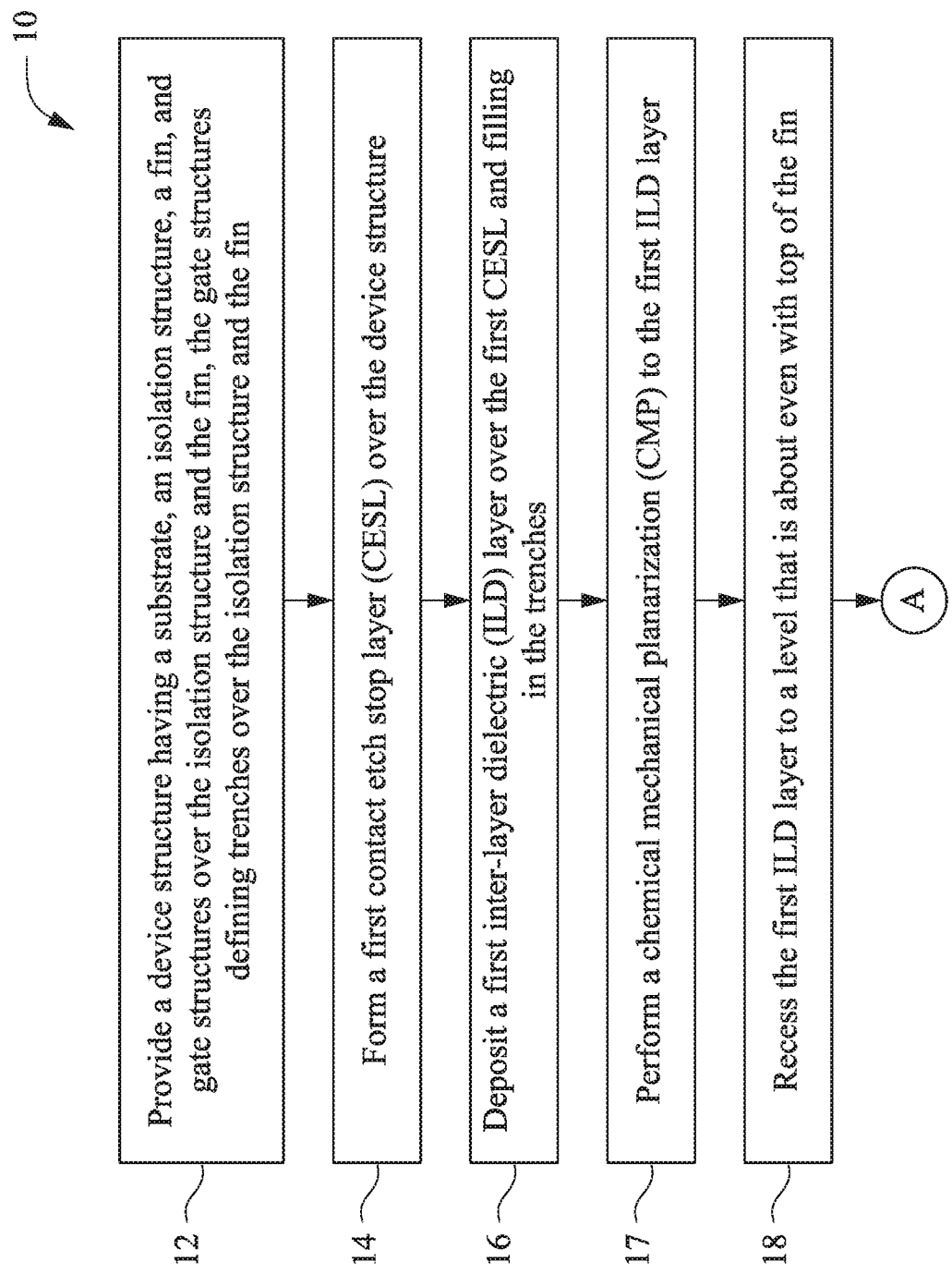
FIGS. 1A, 1B, 1C, and 1D are flow charts of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to contact formation processes in semiconductor manufacturing, particularly FINFET device fabrication. According to some aspects of the present disclosure, contact features such as source/drain (S/D) contacts, local interconnect contacts, and butted contacts are formed to have about the same depth across a large area of a wafer. These contact features tend to maintain their shapes and position over time, increasing the reliability of the circuits. Furthermore, the provided subject matter reduces the aspect ratio (depth over width) of contact holes, effectively reducing the possibility of creating voids under the contact features.

Figure 1B:
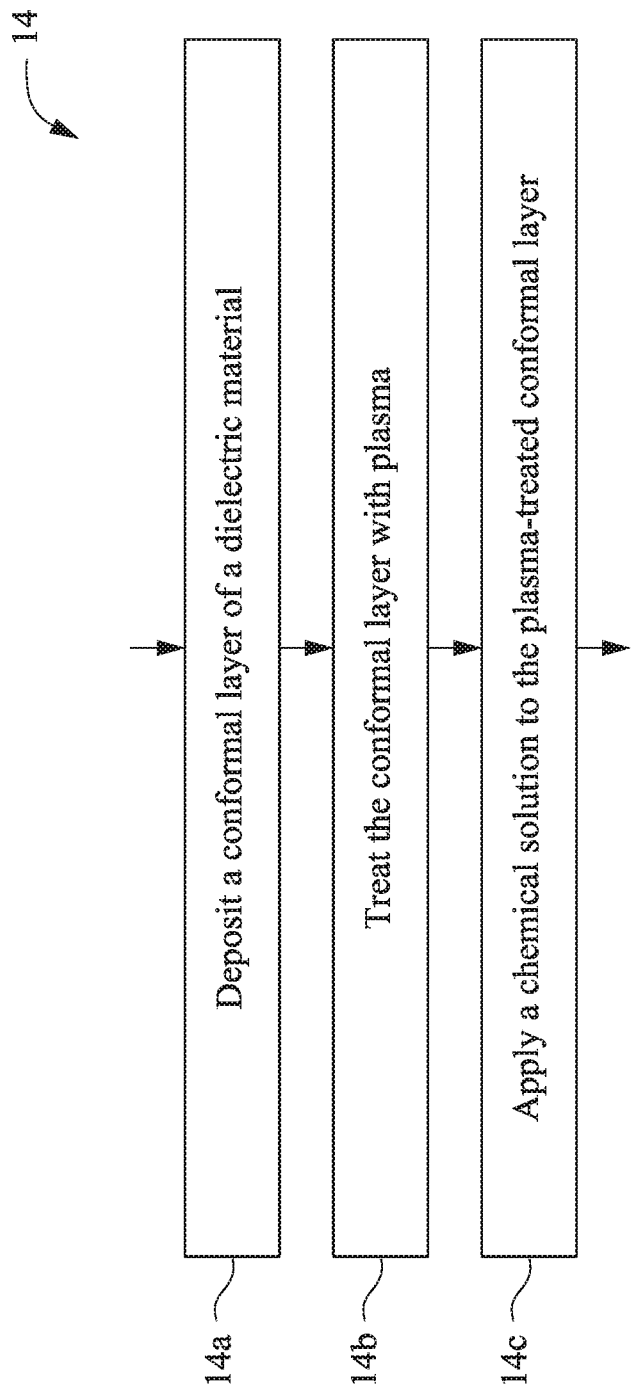
Figure 1C:
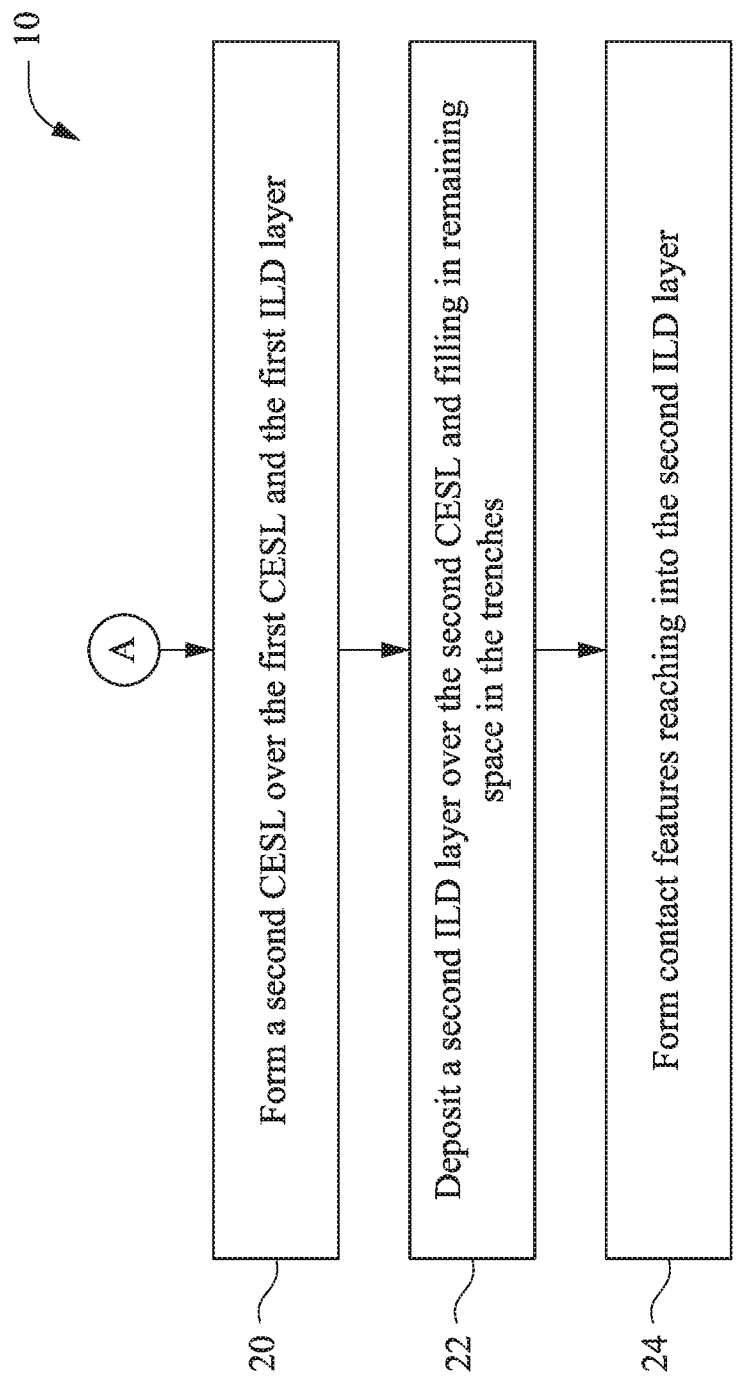
Figure 1D:
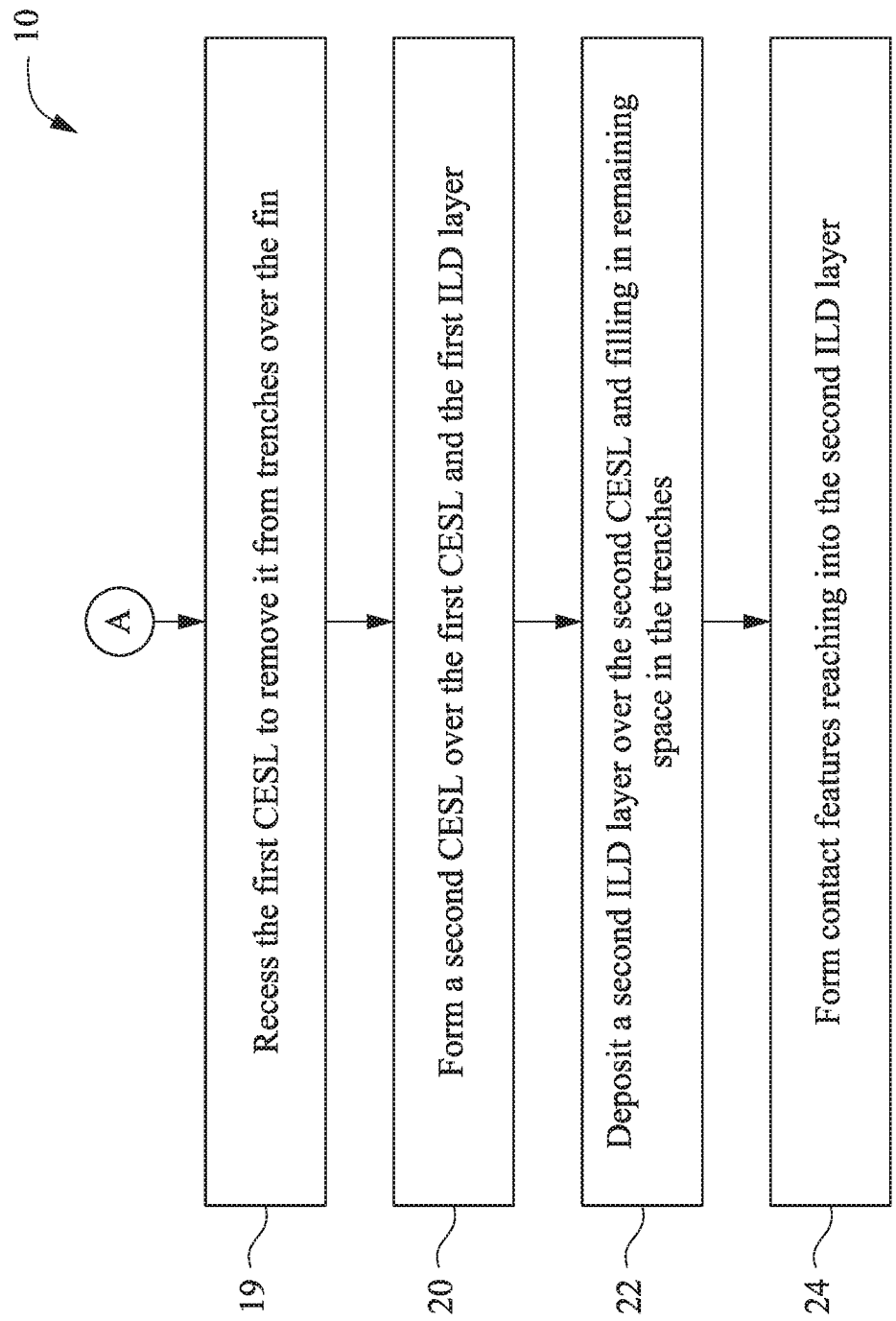
Figure 2:
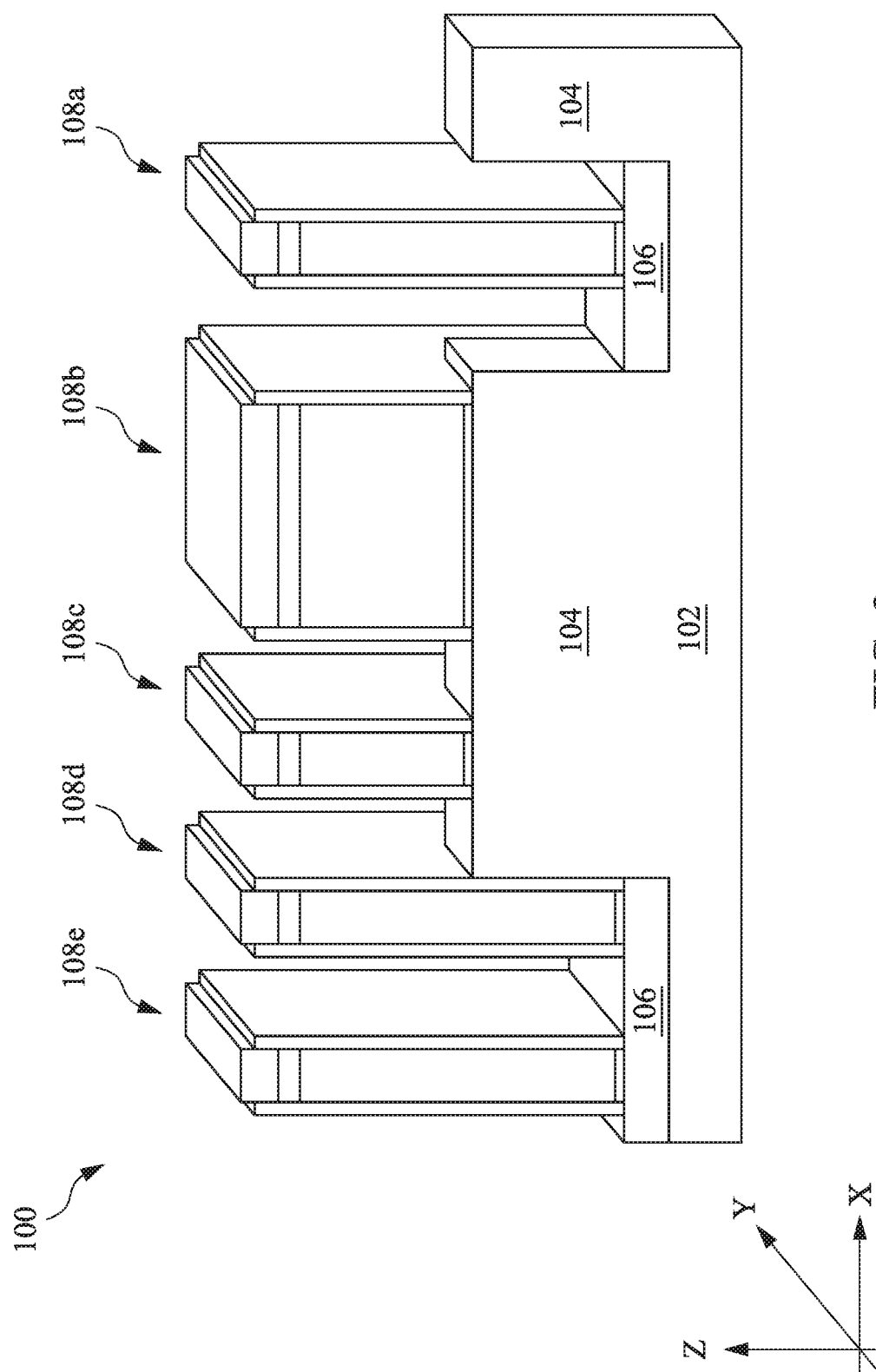
FIG. 2 is a perspective cut-out view of a portion of a semiconductor device constructed according to the method in FIGS. 1A-1D, in accordance with an embodiment.

FIGS. 1A, 1B, 1C, and 1D show flow charts of a method 10 of forming a semiconductor device 100, according to various aspects of the present disclosure. Particularly, FIGS. 1A and 1C show an embodiment of the method 10, and FIGS. 1A and 1D show an alternative embodiment of the method 10. FIG. 1B shows a flow chart of a method that can be included as part of the method 10. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. In the following discussion, the method 10 is first described with reference to FIGS. 1A, 1B, 1C, and 2-10, and is then described with reference to FIGS. 1A, 1D, and 11-17. FIG. 2 illustrates the semiconductor device 100 in an intermediate stage of fabrication in a perspective view, and FIGS. 3-17 illustrate the semiconductor device 100 in intermediate stages of fabrication in a side cross-sectional view of FIG. 2.

The semiconductor device 100 is provided for illustration purposes and does not necessarily limit the embodiments of the present disclosure to any number of devices, any number of regions, or any configuration of structures or regions. Furthermore, the semiconductor device 100 as shown in FIGS. 2-17 may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 3:
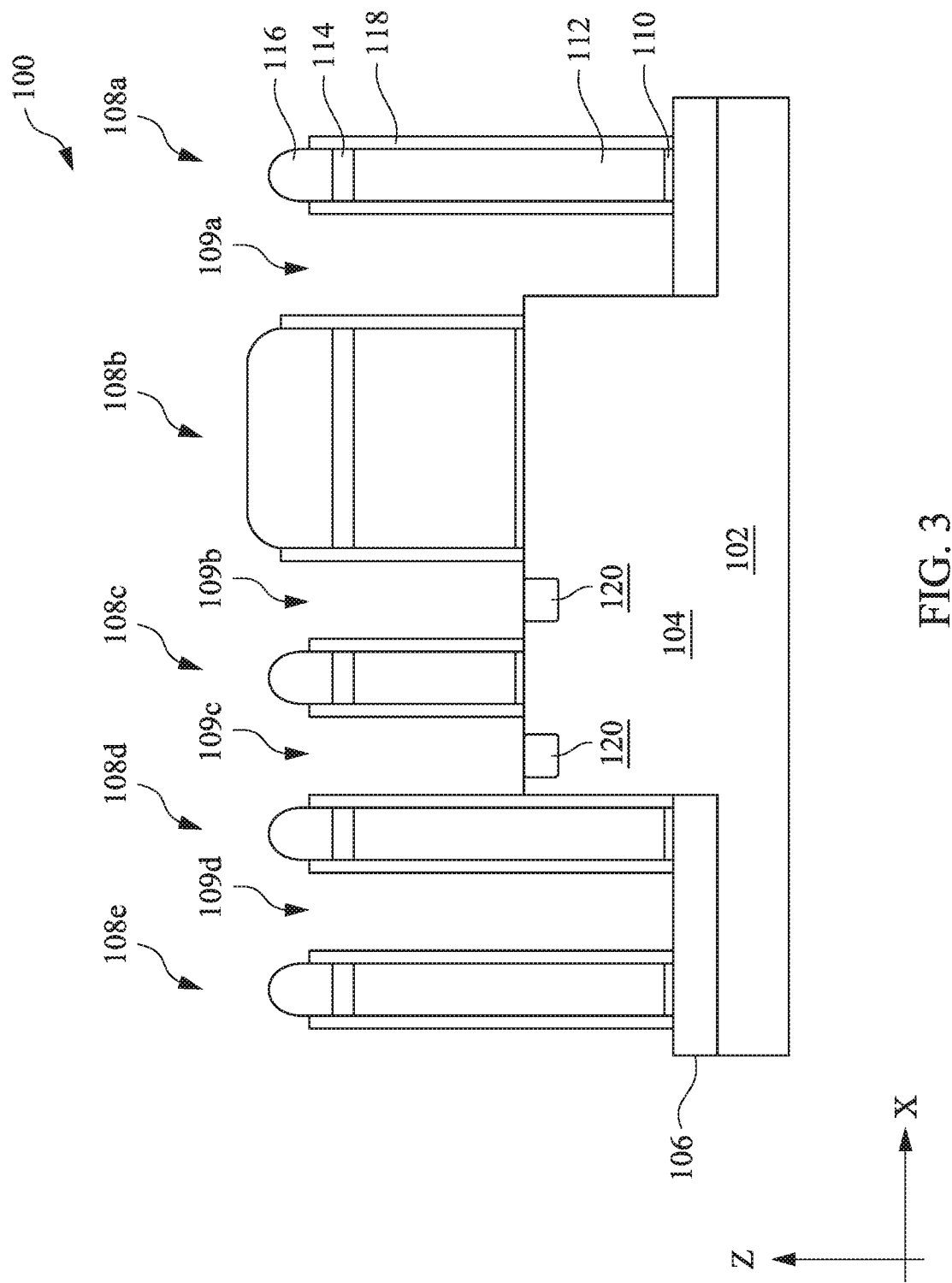
FIGS. 3, 4, 5, 6, 7, 8, 9, and 10 are cross-sectional views of a portion of the semiconductor device of FIG. 2 at intermediate stages of fabrication, according to the method in FIGS. 1A, 1B, and 1C, in accordance with some embodiment.

At operation 12, the method 10 (FIG. 1A) provides or is provided with a device structure (or device) 100 as shown in FIGS. 2-3. Referring to FIG. 2, the device 100 includes a substrate 102, one or more fins 104 extending from the substrate 102, an isolation structure 106 that isolates the fins 104 from each other, and various gate structures 108a, 108b, 108c, 108d, and 108e.

The substrate 102 is a silicon substrate in the present embodiment. In alternative embodiments, the substrate 102 includes other elementary semiconductors such as germanium; a compound semiconductor such as silicon carbide, gallium arsenide, indium arsenide, and indium phosphide; or an alloy semiconductor, such as silicon germanium carbide, gallium arsenic phosphide, and gallium indium phosphide. In embodiments, the substrate 102 may include silicon on insulator (SOI) substrate, be strained and/or stressed for performance enhancement, include epitaxial regions, include isolation regions, include doped regions, and/or include other suitable features and layers.

The fins 104 comprise one or more semiconductor materials such as silicon, germanium, silicon germanium, silicon carbide, gallium arsenide, indium arsenide, indium phosphide, silicon germanium carbide, gallium arsenic phosphide, and gallium indium phosphide. The fins 104 are doped with proper dopants for forming FinFETs. For example, the fins 104 may be doped with one or more p-type dopants, such as boron or indium, or one or more n-type dopants, such as phosphorus or arsenic. The fins 104 may include doped regions such as lightly doped regions and heavily doped regions, and may include epitaxially grown materials.

In the present embodiment, the device 100 further includes S/D features 120 (FIG. 3). In an embodiment, the S/D features 120 are fully embedded in the fin 104 such as heavily doped S/D regions. In another embodiment, the S/D features 120 are partially embedded in the fin 104 and rise above the fin 104, such as epitaxially grown semiconductor material with proper dopant(s). The S/D features 120 may further include silicidation or germanosilicidation. In the present embodiment, two S/D features 120 are shown (FIG. 3) adjacent the gate structure 108c.

The fins 104 may be fabricated using suitable processes including photolithography and etching processes. For example, the photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fins 104 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The fins 104 may also be formed using double-patterning lithography (DPL) processes. Numerous other embodiments of methods to form the fins 104 may be suitable.

The isolation structure 106 may comprise silicon oxide, silicon nitride, silicon oxynitride, fluoride-doped silicate glass (FSG), a low-k dielectric material, and/or other suitable insulating material. The isolation structure 106 may be shallow trench isolation (STI) features in some embodiments. The isolation structure 106 may be formed by etching trenches in the substrate 102, e.g., as part of the fins 104 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 106 may include a multi-layer structure, for example, having one or more thermal oxide liner layers.

In the present embodiment, the fins 104 are taller than the isolation structure 106. In other words, the top surface of the fins 104 is higher than the top surface of the isolation structure 106, along the "Z" direction. This may be formed, for example, by etching back the isolation structure 106 after the fins 104 are formed, or by epitaxially growing the fins 104 from trenches in the isolation structure 106.

Each of the gate structures 108a-e is a multi-layer structure (FIG. 3). In the present embodiment, each of the gate structures 108a-e includes a dielectric layer 110, a gate electrode layer 112, a first hard mask (HM) layer 114, a second HM layer 116, and a spacer layer 118 as the sidewall of the respective gate structure. The dielectric layer 110 may include silicon oxide or silicon oxynitride, and may be formed by chemical oxidation, thermal oxidation, atomic layer deposition (ALD), chemical vapor deposition (CVD), and/or other suitable methods. The gate electrode layer 112 may include a polysilicon layer which can be formed by suitable deposition processes such as low-pressure chemical vapor deposition (LPCVD) and plasma-enhanced CVD (PECVD). The HM layer 114 may include a nitride such as silicon nitride, silicon carbide nitride, silicon oxynitride, and silicon oxycarbide nitride. The HM layer 116 may include an oxide such as silicon oxide. Each of the HM layers 114 and 116 may be formed by CVD, PVD, or ALD methods. The spacer layer 118 may be a single layer or multi-layer structure. The spacer layer 118 may include a dielectric material, such as silicon oxide, silicon nitride, silicon oxynitride, other dielectric material, or combination thereof. In an example, the spacer layer 118 is formed by blanket depositing a first dielectric layer (e.g., a $SiO_2$ layer having a uniform thickness) as a liner layer over the device 100 and a second dielectric layer (e.g., a SiN layer) as a main D-shaped spacer over the first dielectric layer, and then, anisotropically etching to remove portions of the dielectric layers to form the spacer layer 118.

The gate structures 108a-e may have different widths depending on the respective function thereof. For example, the gate structure 108b is wider (along the "x" direction) than the other gate structures. Further, some gate structures (e.g., 108b and 108c) are disposed over the fins 104, and some other gate structures (e.g., 108a, 108d, and 108e) are disposed over the isolation structure 106. The gate structures 108a-e may be designed to have different functions. For example, the gate structure 108c is designed to be a gate terminal (or a placeholder for a gate terminal) of a FINFET. For example, the gate structure 108b may be designed as a local interconnect by connecting the S/D feature 120 using a butted contact to another S/D feature or a gate (not shown). For example, the gate structures 108a, 108d, and 108e may each be designed as interconnect or simply as a dummy gate for device uniformity purposes. When a gate structure is disposed over the fin 104, it engage the fin 104 on three sides thereof, i.e., on the top and sidewalls of the fin 104. FIG. 2 illustrates the gate structures 108b and 108c engaging the top and one sidewall of the fin 104 with the other sidewall of the fin 104 being cut out and not shown.

The various structures 104, 106, and 108a-e provide (or define) various trenches in the device 100. In the embodiment shown, trenches 109a, 109b, 109c, and 109d are provided. Particularly, adjacent sidewalls of the gate structures 108a-e (and in the case of the trench 109a, together with sidewalls of the fin 104) provide the sidewalls for the trenches 109a-d, while the top surface of the fins 104 and the top surface of the isolation structure 106 provide the bottom surface for the trenches 109a-d. It is noted that the trenches 109a-d have different depths in the present embodiment due to the fact that the fins 104 are taller than the isolation structure 106. As the geometry size of the transistors decreases, the aspect ratio of the trenches 109a-d as defined by their height (along the Z direction) over their width (along the X direction) increases, making these trenches deep and narrow. This is particularly evident with the trenches 109a and 109d that have the isolation structure 106 as their bottom surface.

These trenches 109a-d may present two problems for subsequent fabrication processes that form contact features reaching into the bottom of the trenches. First, the contact features in the trenches would have different depths while their top surfaces are at the same level. For example, a contact feature in the trench 109d would have a greater depth (or be longer) than a contact feature in the trench 109c. Over time, the longer contact features may tilt and push against nearby gate structures to cause circuit failure. Second, it may be difficult to fully fill a deep and narrow trench such as the trenches 109a and 109d with metal materials, leaving voids in the trench. These voids may cause circuit open or short over time. The present disclosure provides methods for addressing these issues.

Figure 4:
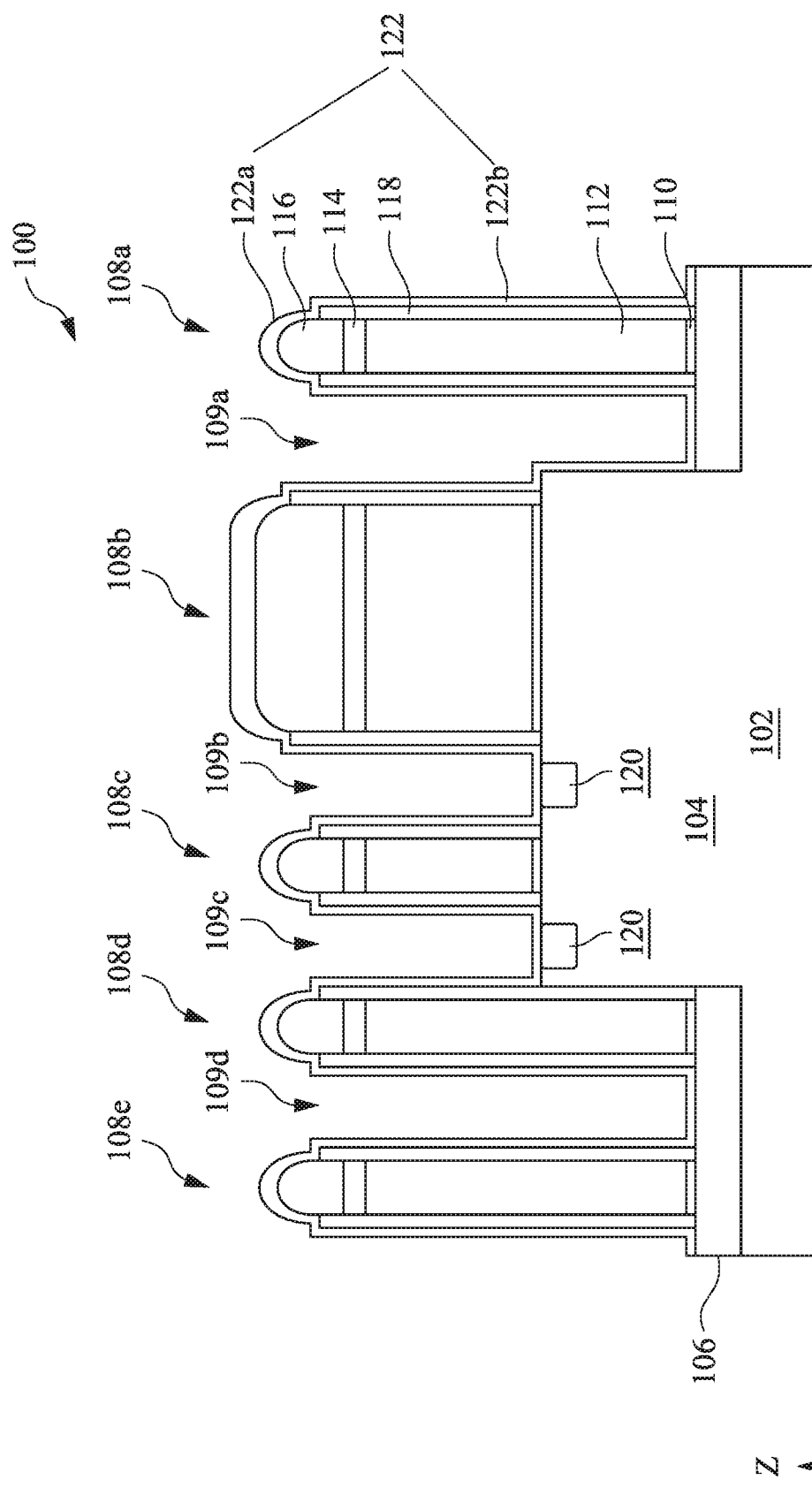
Figure 11:
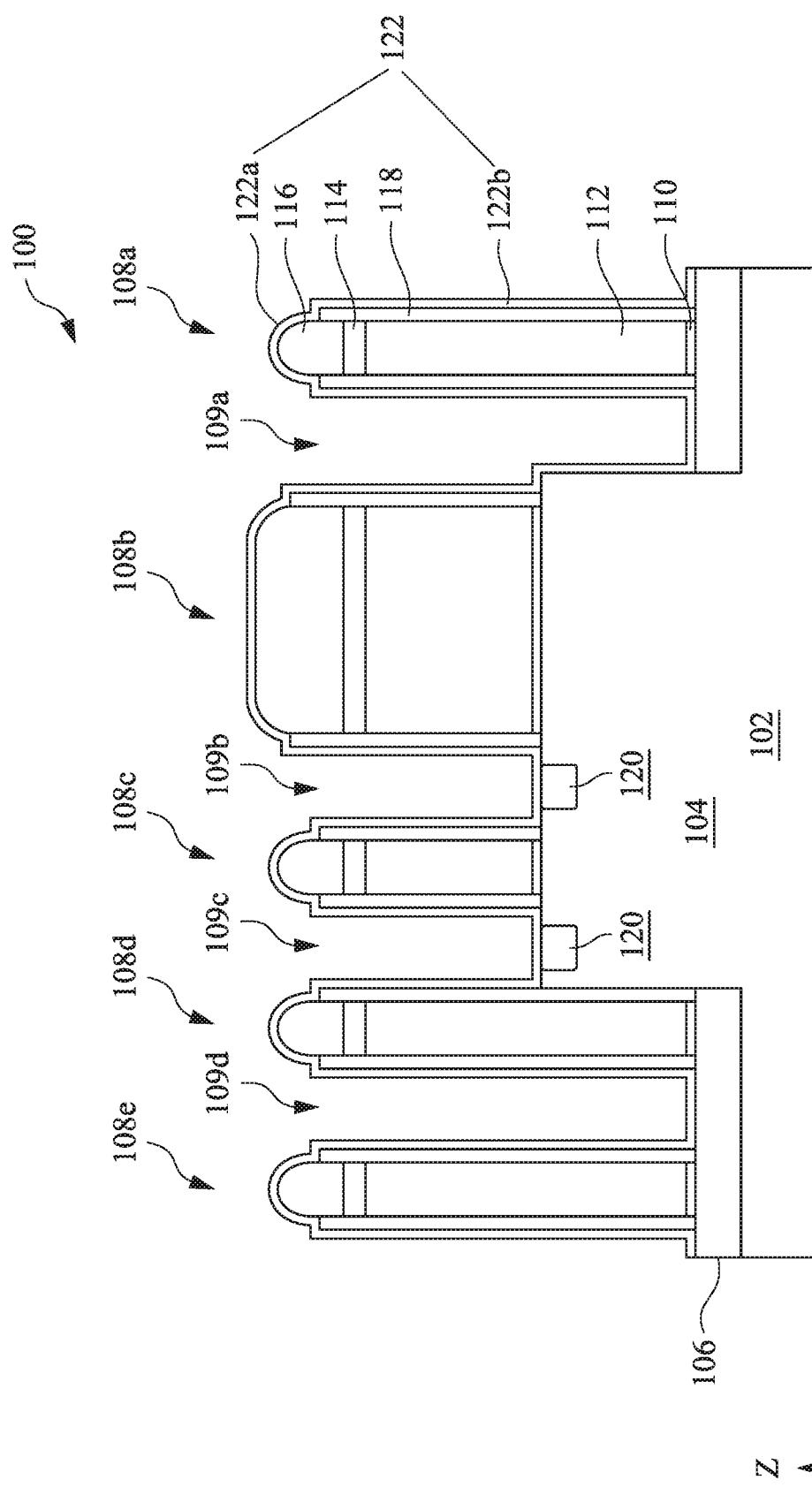
FIGS. 11, 12, 13, 14, 15, 16, and 17 are cross-sectional views of a portion of the semiconductor device of FIG. 2 at intermediate stages of fabrication, according to the method in FIGS. 1A and 1D, in accordance with some embodiment.

At operation 14, the method 10 (FIG. 1A) forms a contact etch stop layer (CESL) 122 over the various structures of the device 100. Referring to FIG. 4, the CESL 122 is formed over the surfaces of the fin 104, the isolation structure 106, the gate structures 108a-e, and the S/D features 120. In an embodiment, the CESL 122 includes a dielectric material such as silicon nitride (SiN), silicon oxide (SiO$_2$), silicon oxynitride (SiON), and/or other materials. The CESL 122 may be formed by one or more methods including plasma enhanced CVD (PECVD), ALD, and/or other suitable deposition or oxidation processes. In the present embodiment, a top portion 122a of the CESL 122 on top of the gate structures 108a-e is formed to be thicker than another portion 122b of the CESL 122 on sidewalls of the gate structures 108a-e. In an alternative embodiment (as shown in FIG. 11 to be discussed later), the CESL 122 is formed to be conformal, i.e., having about the same thickness throughout the device 100. Other thickness profiles of the CESL 122 are also contemplated to be within the scope of the present disclosure.

FIG. 1B shows a flow chart of an embodiment of operation 14 that forms the top portion 122a thicker than the sidewall portion 122b. Referring to FIG. 1B, the operation 14 in this embodiment includes steps 14a, 14b, and 14c. In step 14a, the operation 14 deposits a conformal layer 122 of a dielectric material, for example, by an ALD method. The dielectric material is deposited substantially uniformly over the top and sidewalls of the gate structures 108a-e, the top and sidewalls of the fins 104, and the top of the isolation structure 106. In step 14b, the operation 14 treats the conformal layer with plasma such as argon plasma and/or nitrogen plasma. In a particular example, the plasma treatment is directional, i.e., the top portion 122a of the conformal layer 122 receives more plasma treatment than the sidewall portion 122b of the conformal layer 122. In step 14c, the operation 14 applies a chemical solution to the plasma treated conformal layer 122. The chemical solution dissolves or etches the sidewall portion 122b at a faster rate than it dissolves or etches the top portion 122a. As a result, the top portion 122a becomes thicker than the sidewall portion 122b. In an example, the chemical solution includes dilute hydrofluoric acid (DHF). There are benefits associated with the particular profile (top being thicker than sidewall) of the CESL 122. First, the top portion 122a serves as a CMP stop in a subsequent CMP process. If it is too thin, it will not be effective. In some embodiments, the top portion 122a is at least 4 nm thick. Second, the presence of the sidewall portion 122b further increases the aspect ratio of the trenches 109a-d, which is undesirable. Therefore, the sidewall portion 122b is desired to be as thin as possible. In some embodiments, the sidewall portion 122b (or part thereof) is removed and the spacer layer 118 is exposed.

Figure 5:
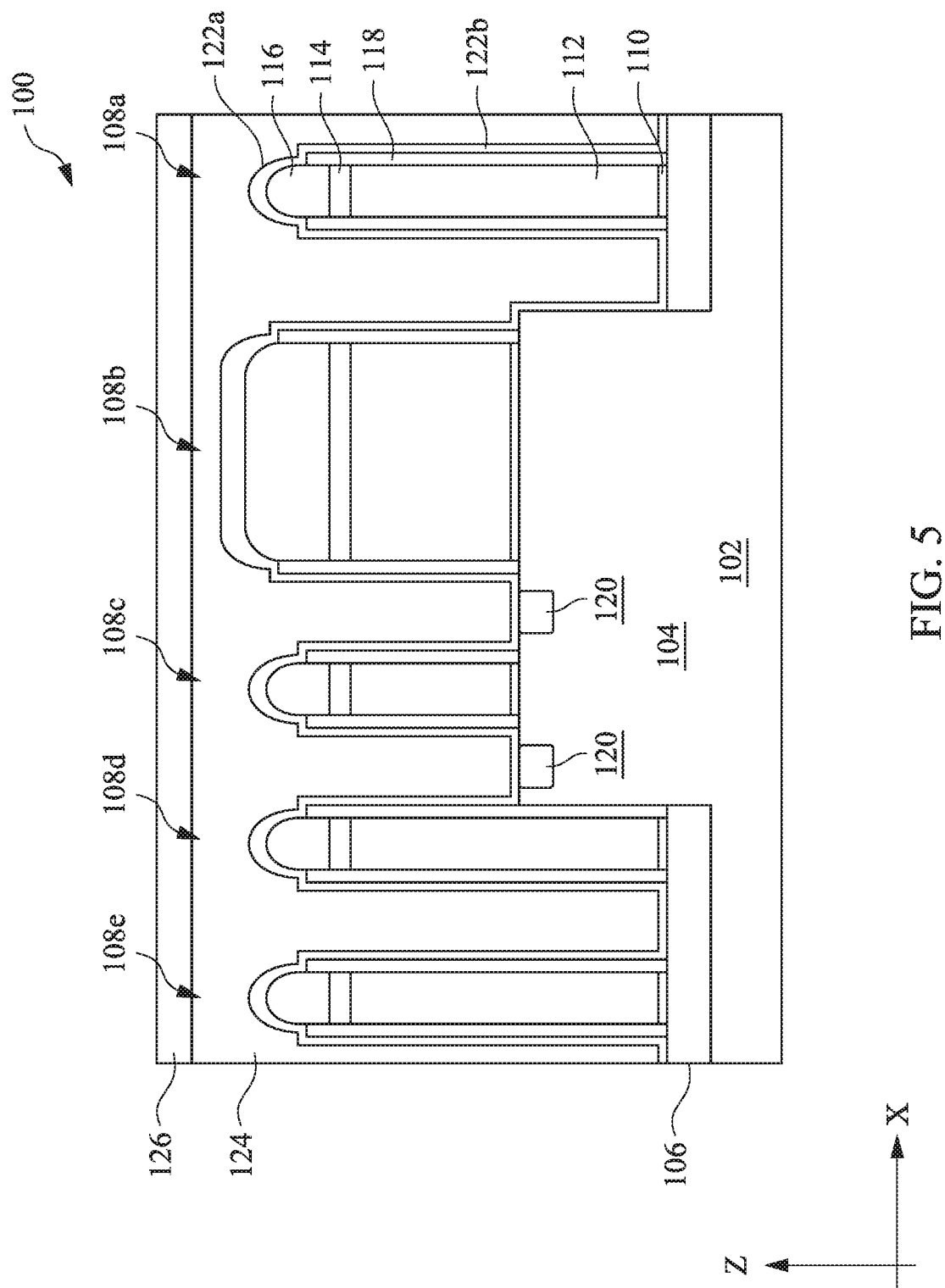

At operation 16, the method 10 (FIG. 1A) deposits an inter-layer dielectric (ILD) layer 124 over the first CESL 122. Referring to FIG. 5, the ILD layer 124 fills the various trenches and covers the gate structures 108a-e, the fins 104, and the isolation structure 106. In an embodiment, the ILD layer 124 is deposited by a flowable chemical vapor deposition (FCVD) method. For example, a flowable material (such as a liquid compound) is deposited on the device 100 and fills the trenches 109a-d (FIG. 4). Then, one or more annealing processes are performed to convert the flowable material to a solid material. In an alternative embodiment, the ILD layer 124 may be deposited by other deposition methods such as a plasma enhanced CVD (PECVD) method. The ILD layer 124 may include materials such as tetraethylorthosilicate (TEOS) oxide, un-doped silicate glass, or doped silicon oxide such as borophosphosilicate glass (BPSG), fused silica (FSG), phosphosilicate glass (PSG), boron doped silicon glass (BSG), a low-k dielectric material, and/or other suitable dielectric materials. In the present embodiment, the operation 16 further deposits an oxide layer 126 over the ILD layer 124, for example, by PECVD.

Figure 6:
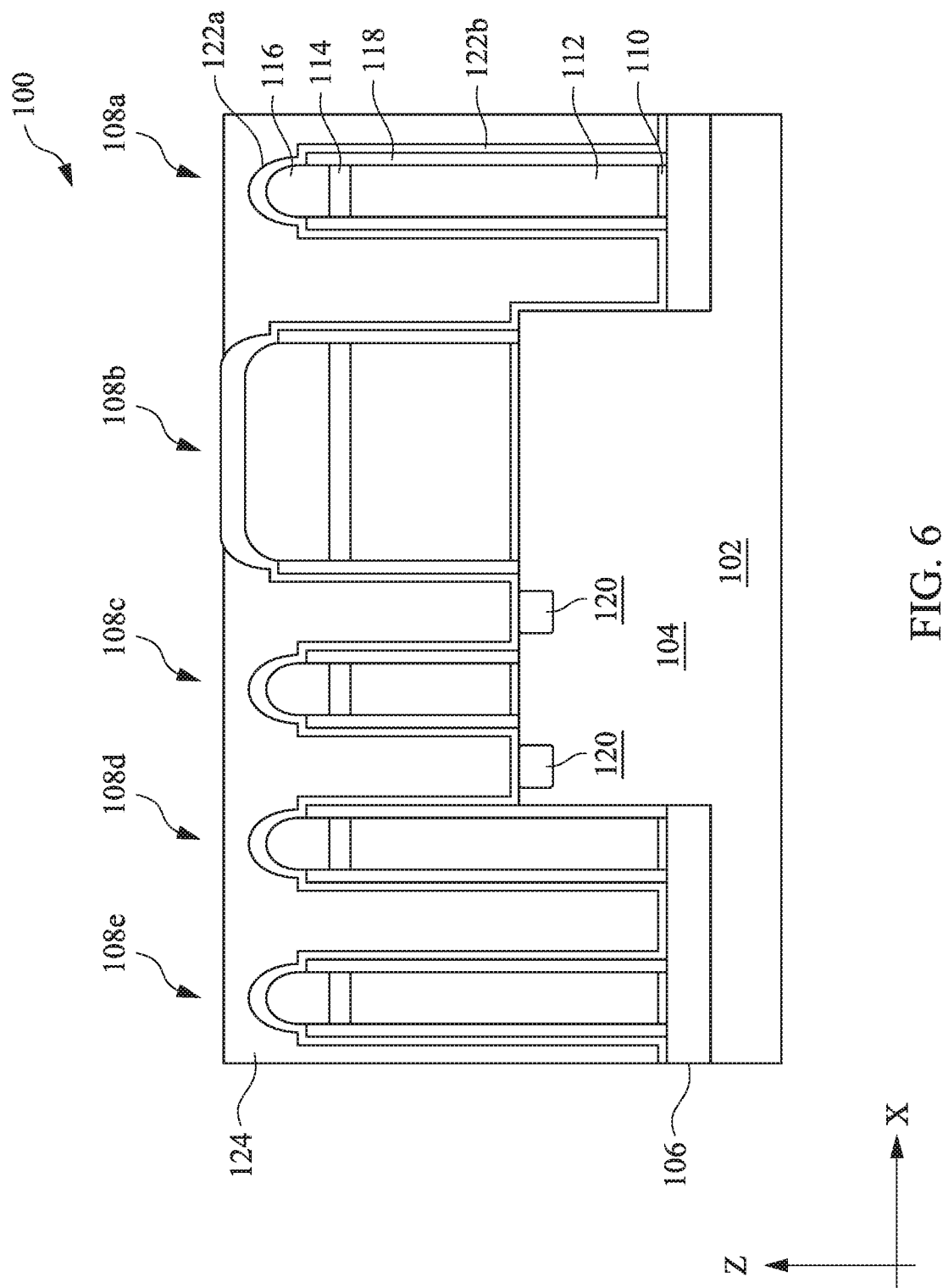

At operation 17, the method 10 (FIG. 1A) performs a chemical mechanical planarization (CMP) process to the ILD layer 124. In the present embodiment, the CMP process first removes the oxide layer 126, and then recesses the ILD layer 124 until a top surface of the CESL 122 is exposed, such as shown in FIG. 6. The top portion 122a serves as CMP stop in the present embodiment.

Figure 7:
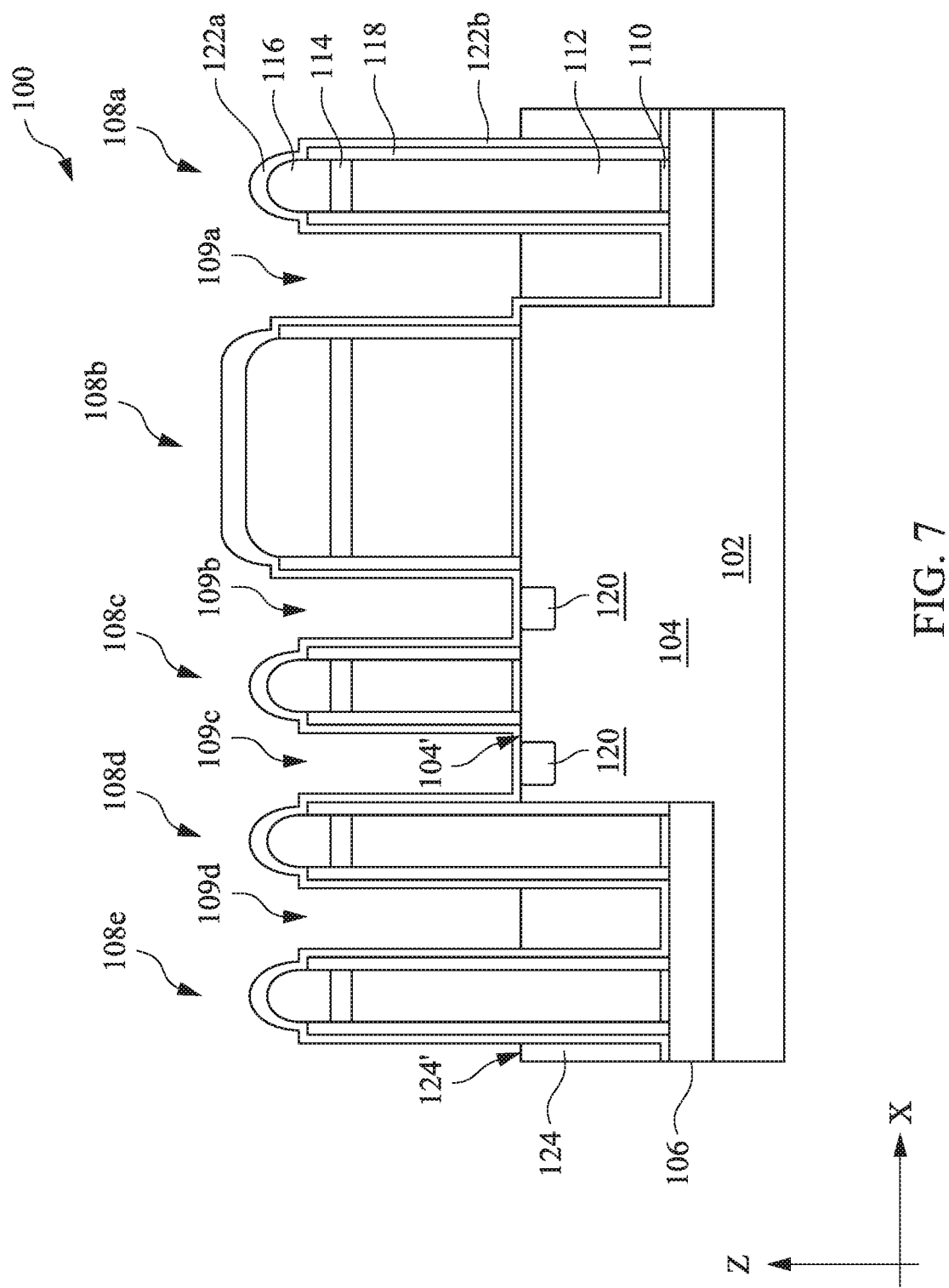

At operation 18, the method 10 (FIG. 1A) recesses the ILD layer 124 by an etching process. The etching process is dry etching in an embodiment. The etching process is tuned to selectively etch the ILD layer 124 but not (or insignificantly) the CESL 122. Referring to FIG. 7, the ILD layer 124 over the fins 104 is removed and the ILD layer 124 over the isolation structure 106 is recessed such that its top surface 124' is at about the same level as the top surface 104' of the fins 104. One purpose of having the ILD layer 124 is to provide about the same depth in the trenches 109a-d so that contact features, if any, formed in the trenches will have about the same depths. Therefore, it is desirable to have the top surface 124' to be about even with (at about the same level as) the top surface 104'. In an embodiment, the etching process is controlled by a timer to achieve the particular depth of etching. In the present embodiment, the method 10 is going to form some contact features reaching into the S/D features 120. Having some of the ILD layer 124 over the S/D features 120 may prevent the contact features from electrically contacting the S/D features 120 properly. Therefore, the ILD layer 124 in the trenches 109b-c is completely removed in the present embodiment, for example, by performing some over-etching to the ILD layer 124. The same over-etching also recesses the ILD layer 124 in the trenches 109a and 109d such that the top surface 124' may become slightly below the top surface 104'. In some embodiments, the top surface 124' may be slightly below the top surface 104' by up to few nanometers, such as less than or equal to 15 nanometers.

Figure 8:
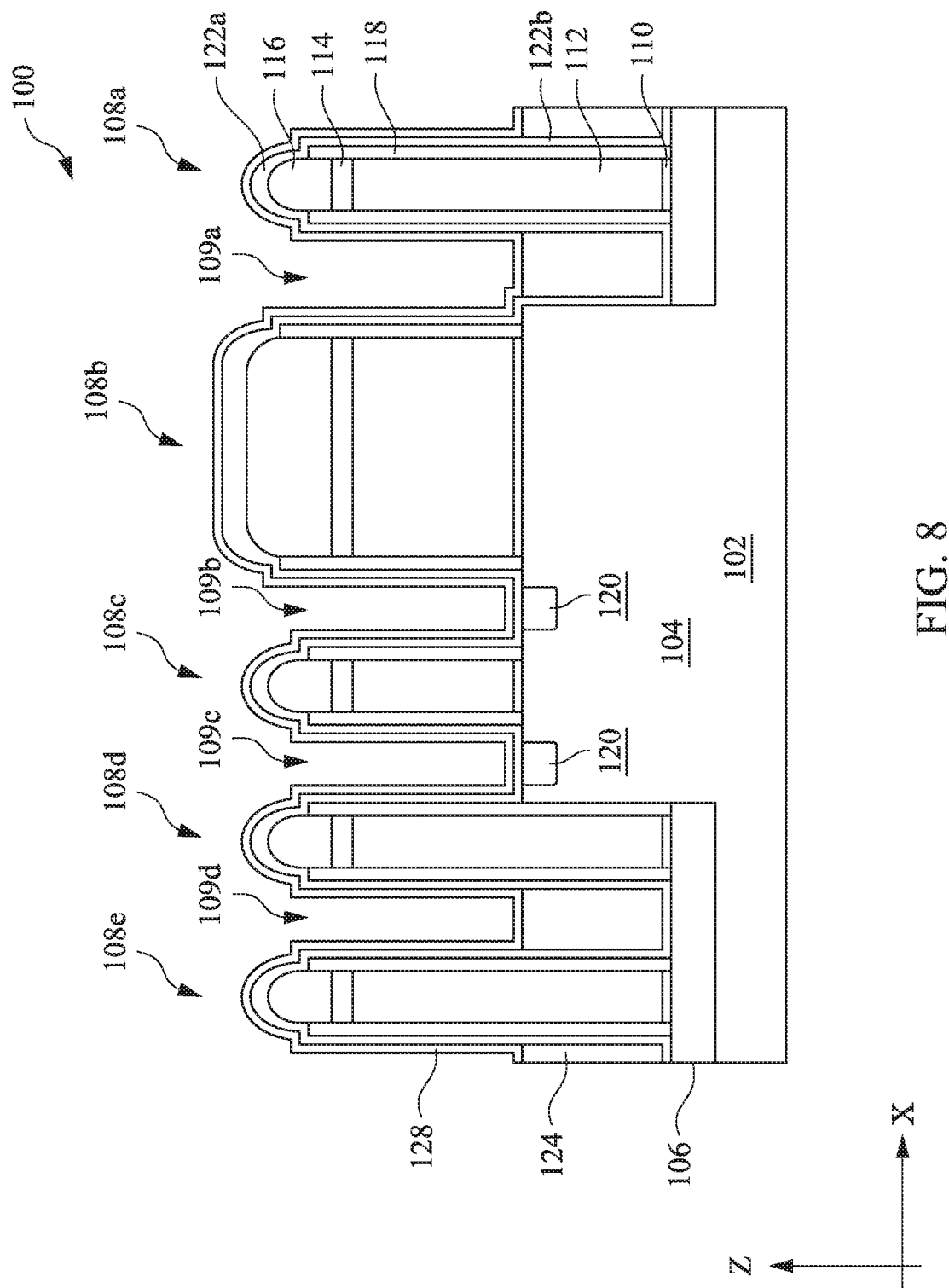

At operation 20, the method 10 (FIG. 1C) forms a second CESL 128 over the CESL 122 and over the ILD layer 124. Referring to FIG. 8, the CESL 128 is formed to be a conformal layer in the present embodiment and it covers the topography of the device 100. The CESL 128 includes a dielectric material such as silicon nitride (SiN), silicon oxide ($SiO_2$), silicon oxynitride (SiON), and/or other materials. The CESL 128 may be formed by one or more methods including plasma enhanced CVD (PECVD), ALD, and/or other suitable deposition or oxidation processes. In various embodiments, the CESL 122 and the CESL 128 may comprise the same or different dielectric materials. In the present embodiment, the combined thickness of the CESL 122 and the CESL 128 on the sidewalls of the gate structures 108a-e is designed to be as thin as possible so that the aspect ratio of the trenches 109a-d is within a target range.

Figure 9:
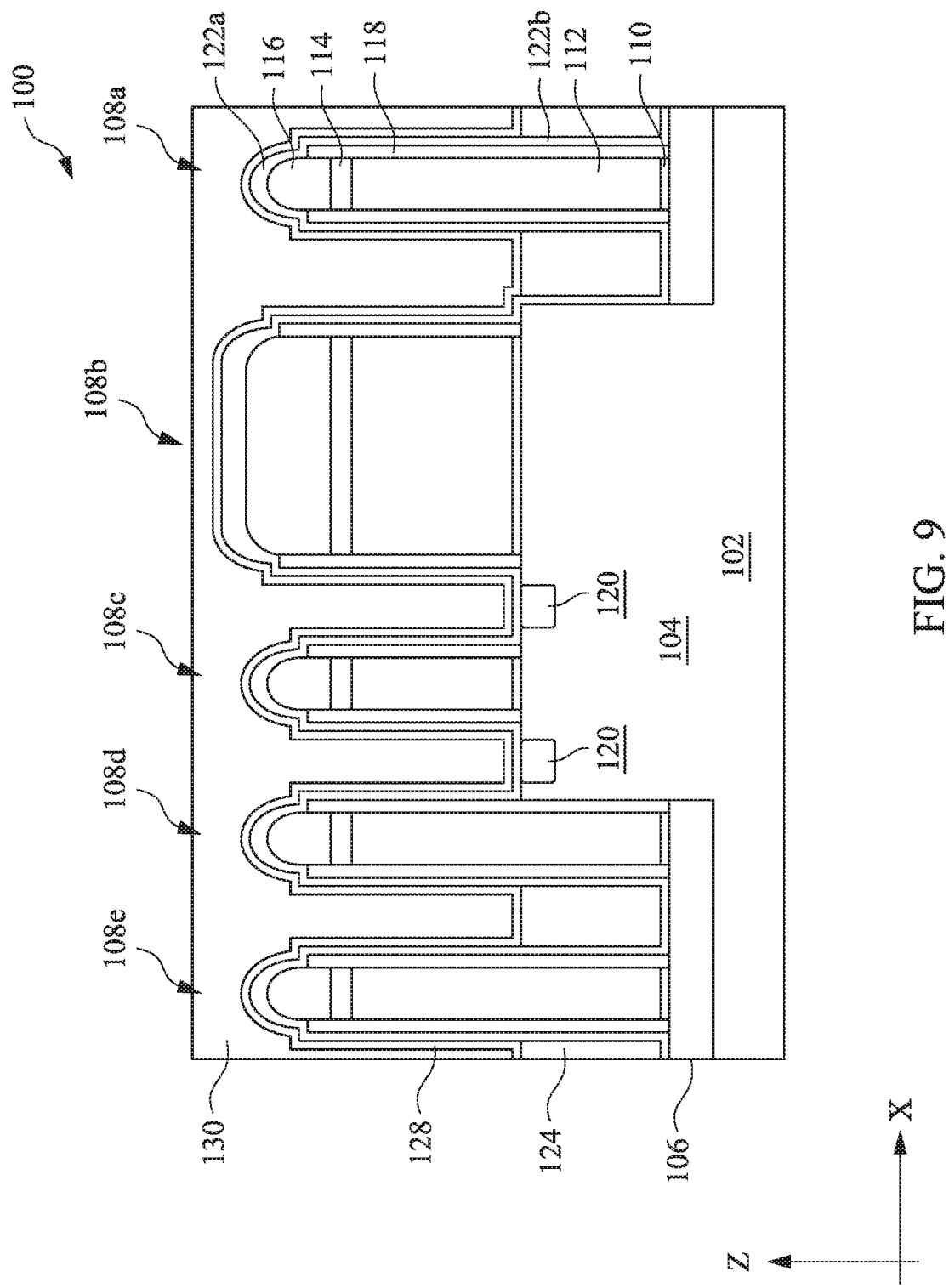

At operation 22, the method 10 (FIG. 1C) deposits a second ILD layer 130 over the CESL 128. Referring to FIG. 9, the ILD layer 130 fills in the trenches and covers the topography of the device 100. In an embodiment, the ILD layer 130 is deposited by a FCVD method including depositing a flowable material and annealing the flowable material. In an alternative embodiment, the ILD layer 130 may be deposited by other deposition methods such as a plasma enhanced CVD (PECVD) method. The ILD layer 130 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), a low-k dielectric material, and/or other suitable dielectric materials. Further, the ILD layers 124 and 130 may comprise the same or different dielectric materials.

Figure 10:
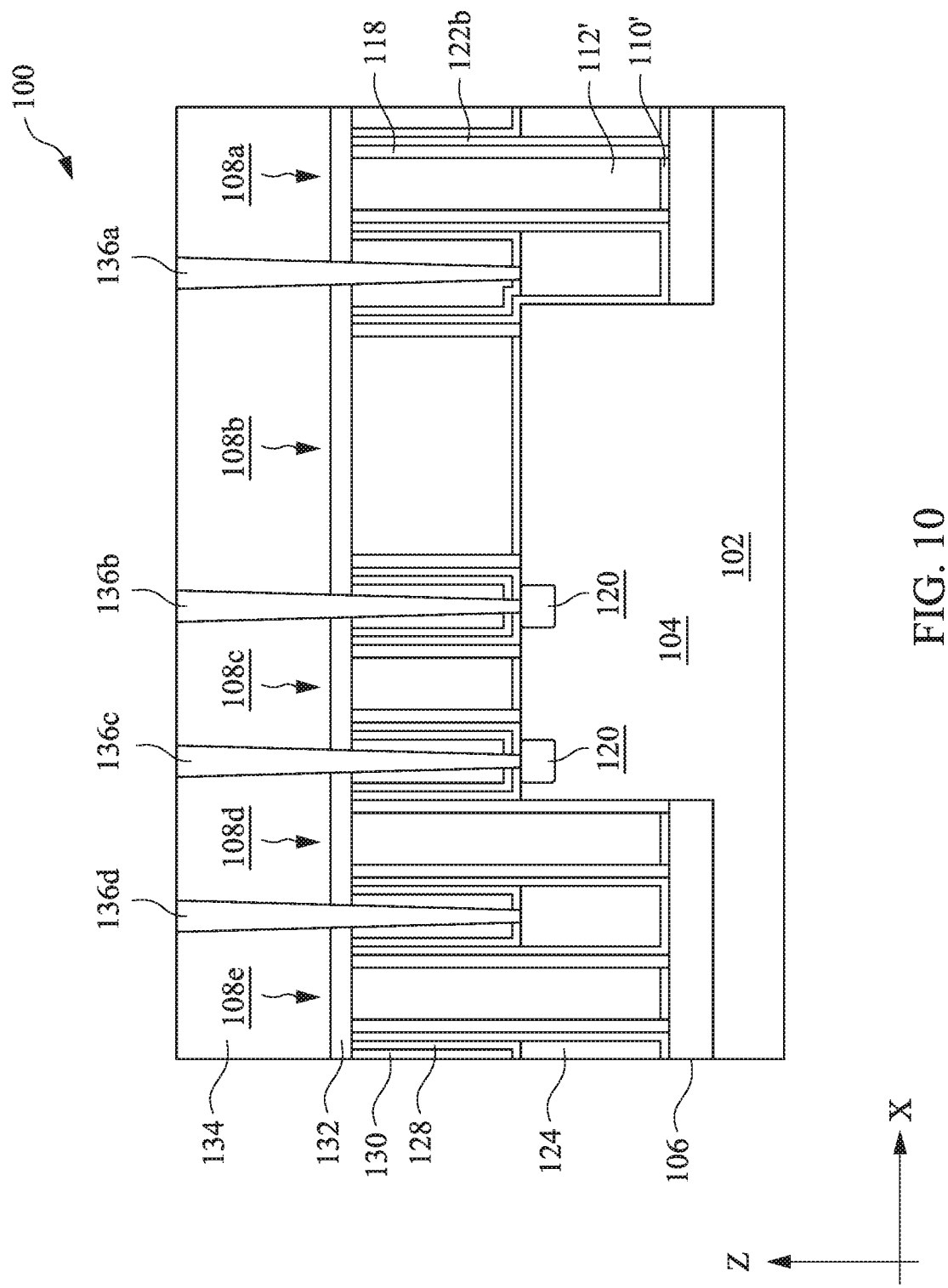

At operation 24, the method 10 (FIG. 1C) forms contact features 136a, 136b, 136c, and 136d reaching into the second ILD layer 130, as shown in FIG. 10. This includes a variety of processes in the present embodiment, as discussed below.

Firstly, the operation 24 performs one or more CMP processes to recess the ILD layer 130, the CESL 128, the CESL 122, and the spacer layer 118, and to remove the HM layers 116 and 114. As a result of the one or more CMP processes, the gate electrode layer 112 is exposed.

Secondly, the operation 24 performs one or more etching processes that selectively remove the gate electrode layer 112 without etching the ILD layer 130, the CESL 128, the CESL 122, and the spacer layer 118. In some embodiment, the one or more etching processes also remove the dielectric layer 110. As a result, trenches are formed between each pair of the spacer layer 118. Subsequently, the operation 24 deposits a gate dielectric layer 110' and a gate electrode layer 112' into the trenches. The gate dielectric layer 110' may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The gate electrode layer 112' may include a p-type work function metal layer or an n-type work function metal layer. The p-type work function metal layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function metal layer comprises a metal selected from, but not limited to, the group of titanium (Ti), aluminum (Al), tantalum carbide (TaC), tantalum carbide nitride (TaCN), tantalum silicon nitride (TaSiN), or combinations thereof. The p-type or n-type work function metal layer may include a plurality of layers and may be deposited by CVD, PVD, and/or other suitable process. The gate electrode layer 112' may further include a metal fill (or a bulk metal) layer that includes aluminum (Al), tungsten (W), cobalt (Co), copper (Cu), and/or other suitable materials, and may be formed by CVD, PVD, plating, and/or other suitable processes. The operation 24 may further perform a CMP process to remove excessive material of the gate electrode 112'.

Thirdly, the operation 24 deposits a third CESL 132 on top of the ILD layer 130, the CESL 128, the CESL 122, the spacer layer 118, and the gate electrode 112'. The CESL 132 may comprise silicon nitride (SiN), silicon oxide (SiO2), silicon oxynitride (SiON), and/or other materials, and may be formed by one or more methods including plasma enhanced CVD (PECVD), ALD, and/or other suitable methods. Thereafter, the operation 24 deposits another ILD layer 134 over the CESL 132. The ILD layer 134 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), a low-k dielectric material, and/or other suitable dielectric materials. The ILD layer 134 may be formed by FCVD, PECVD, or other suitable methods.

Fourthly, the operation 24 etches contact holes that penetrate the ILD layer 134, the CESL 132, the ILD layer 130, the CESL 128, and the CESL 122. Over the top of the fins 104, the contact holes expose a part of the S/D features 120. Over the top of the isolation structure 106, the contact holes expose a top portion of the ILD layer 124. Because the top surface 124' is about even with the top surface 104' (FIG. 7), the contact holes above the fins 104 and above the isolation structure 106 have about the same depth as measured from the top of the ILD layer 134.

Finally, the operation 24 deposits one or more conductive materials into the contact holes to form the contact features 136a-d. Each of the contact features 136a-d may include a barrier layer and a metal fill layer over the barrier layer. The barrier layer may include a conductive nitride such as TaN or TiN, and the metal fill layer may include aluminum (Al), tungsten (W), copper (Cu), cobalt (Co), combinations thereof, or other suitable material. Each of the barrier layer and the metal fill layer may be formed by PVD, CVD, plating, or other suitable methods. In an embodiment, a silicidation or germano-silicidation may be formed underneath the barrier layer and above the S/D features 120. Advantageously, since the contact features 136a-d have about the same depth and size, they tend to maintain their shapes and positions over time without tilting. Furthermore, since the contact holes above the isolation structure 106 are relatively shallower than what they would have been without the ILD layer 124, they become relatively easier to be completely filled with the contact features 136a and 136d, reducing the likelihood of having voids under these contact features.

The method 10 may proceed to further operations to complete the fabrication of the device 100. For example, the method 10 may form one or more dielectric layers atop the ILD layer 134, form gate contact plugs (vias) over the gate electrodes 112', and form metal interconnects to connect terminals of various transistors to form an IC.

FIGS. 1A and 1D illustrate a flow chart of another embodiment of the method 10 which is described below in conjunction with FIGS. 11-17.

At operation 12, the method 10 (FIG. 1A) provides or is provided with a device structure (or device) 100 as shown in FIGS. 2-3. This has been described above.

At operation 14, the method 10 (FIG. 1A) forms a contact etch stop layer (CESL) 122 over the various structures of the device 100, as shown in FIG. 11. Different from the embodiment shown in FIG. 4, the CESL 122 in FIG. 11 is substantially conformal, i.e., its top portion 122a has about the same thickness as its sidewall portion 122b, and may be formed by an ALD method. Other aspects of the CESL 122 have been described above with reference to FIG. 4.

Figure 12:
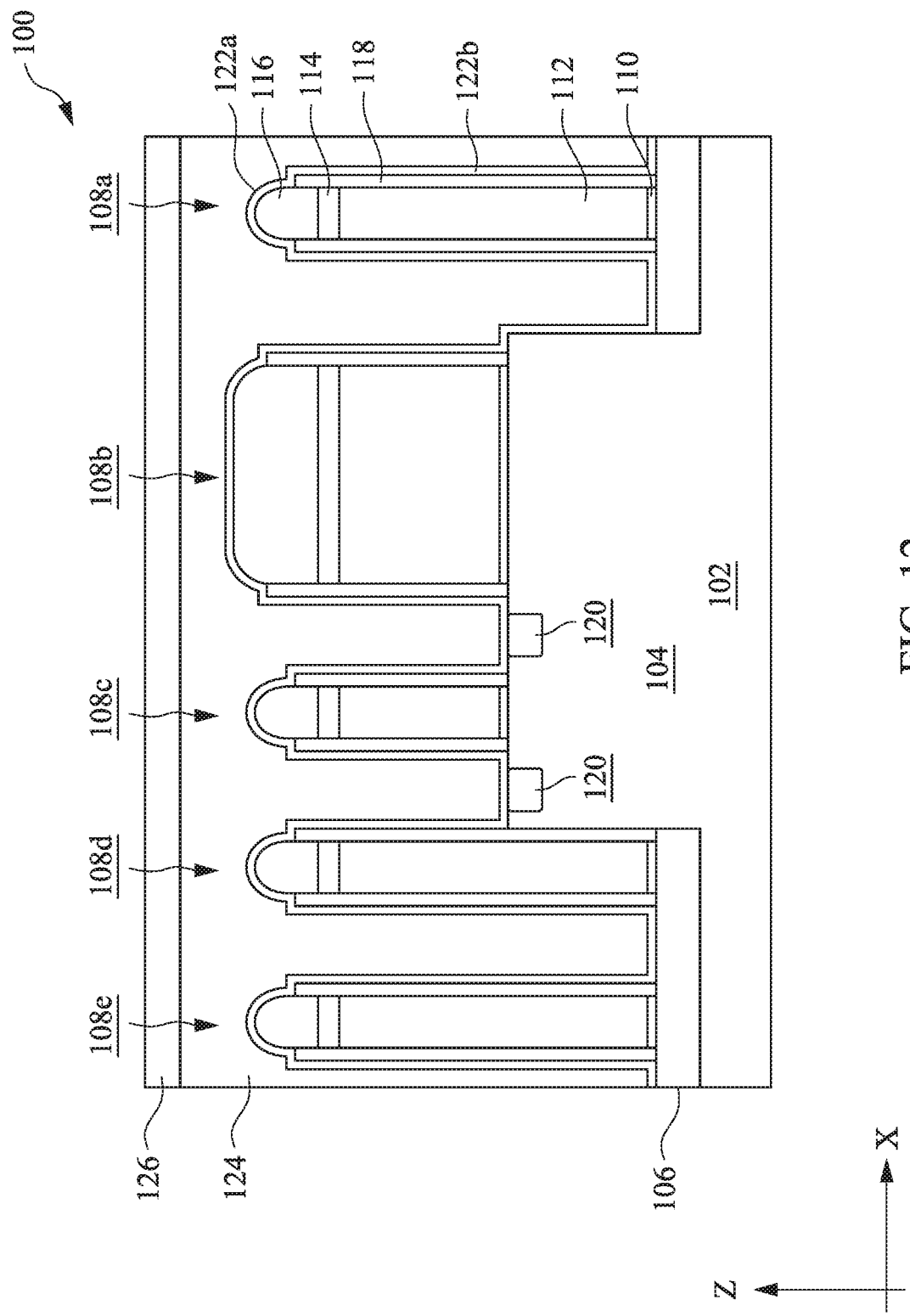

At operation 16, the method 10 (FIG. 1A) deposits an inter-layer dielectric (ILD) layer 124 over the CESL 122, as shown in FIG. 12. The operation 16 may further deposit an oxide layer 126 over the ILD layer 124. The materials and the deposition methods of the layers 124 and 126 have been described above with reference to FIG. 5.

At operation 17, the method 10 (FIG. 1A) performs a CMP process to remove the oxide layer 126 and recess the ILD layer 124, thereby exposing the CESL layer 122.

Figure 13:
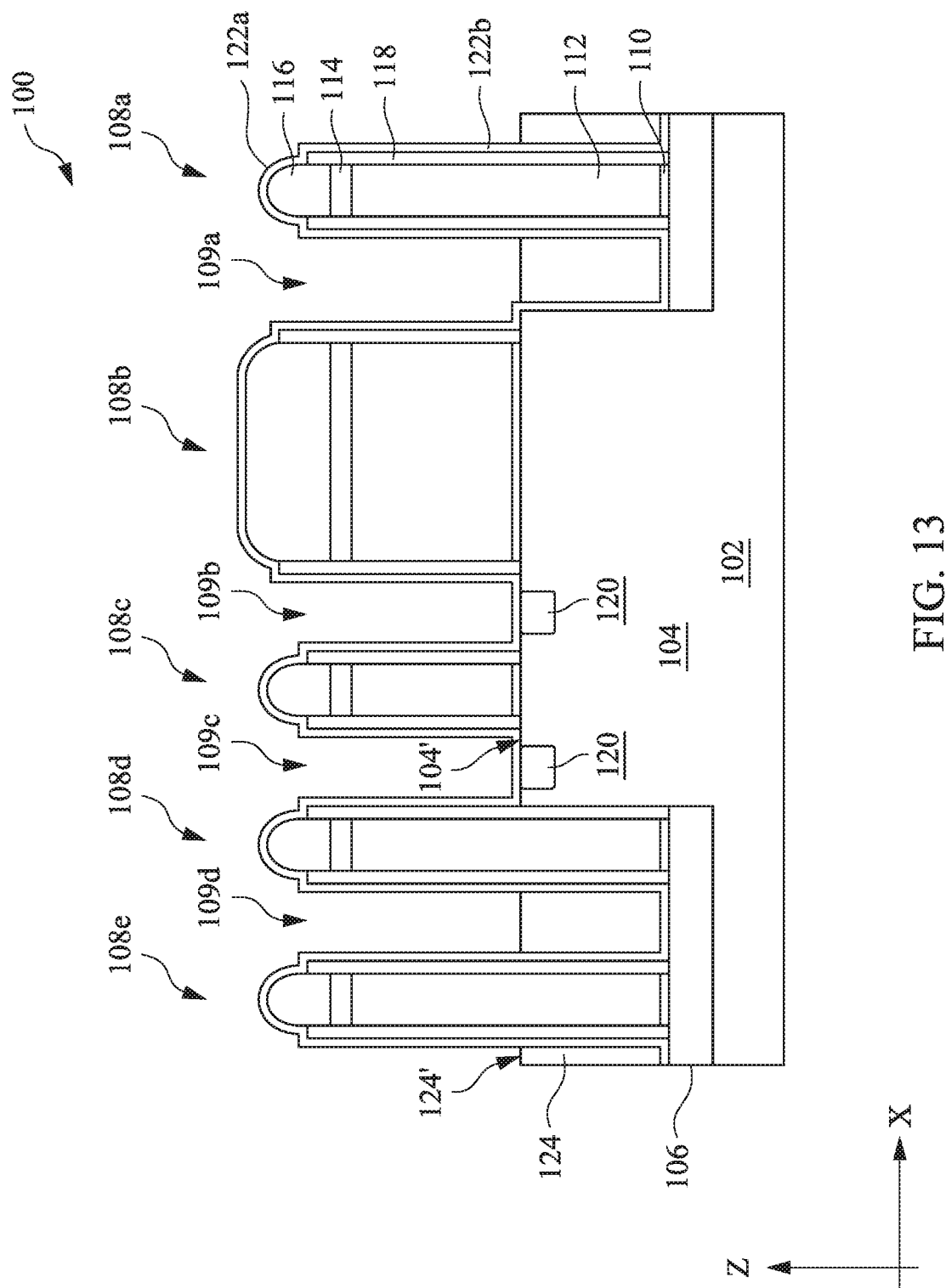

At operation 18, the method 10 (FIG. 1A) recesses the ILD layer 124 by an etching process, such as a dry etching process. The etching process is tuned to selectively etch the ILD layer 124 but not (or insignificantly) the CESL 122. Referring to FIG. 13, the ILD layer 124 over the fins 104 is removed and the ILD layer 124 over the isolation structure 106 is recessed such that its top surface 124' is at about the same level as the top surface 104' of the fins 104. The top surface 124' may be slightly lower than the top surface 104' is some embodiments due to over-etching, as discussed above with reference to FIG. 7.

Figure 14:
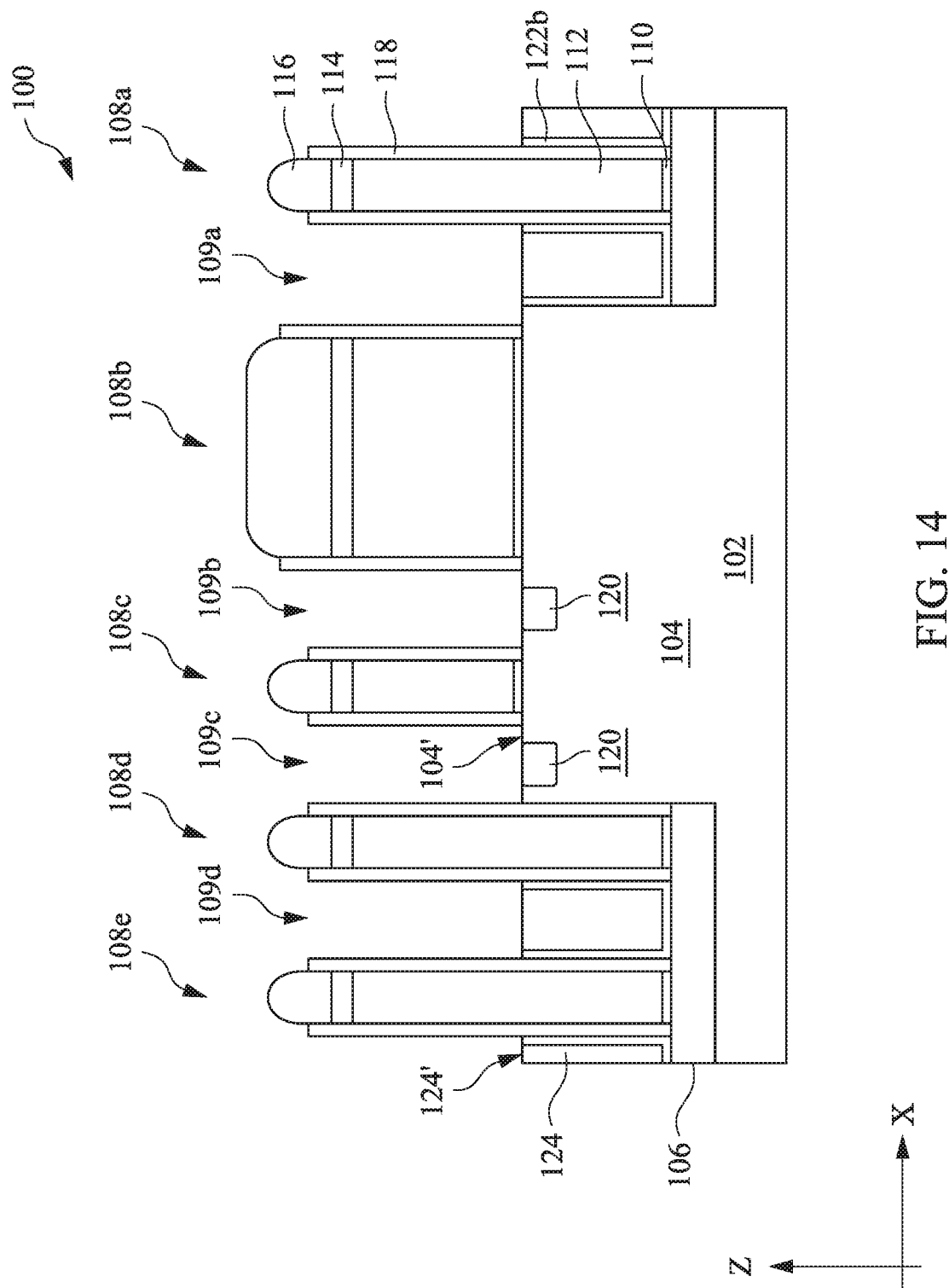

At operation 19, the method 10 (FIG. 1D) recesses the CESL 122. Referring to FIG. 14, the operation 19 removes the CESL 122 from the trenches 109b-c, and recesses the CESL 122 from the trenches 109a and 109d until it is at or below the top surface 124'. The operation 19 includes an etching process that is tuned to selectively remove the material of the CESL 122 without substantially removing the HM layer 116, the spacer layer 118, the fins 104, the S/D featured 120, and the ILD layer 124. In an embodiment, the CESL 122 comprises silicon nitride, the HM layer 116 comprises silicon oxide, the spacer layer 118 comprises silicon oxynitride, silicon carbide nitride, silicon oxycarbide nitride, or silicon nitride (different from the material of the CESL 122), and the S/D features 120 comprises phosphorous doped silicon. To further this embodiment, the operation 19 applies an etchant comprising phosphoric acid ($H_3PO_4$). The phosphoric acid etches the CESL 122 much faster than it etches the HM layer 116, the spacer layer 118, the ILD layer 124, the fins 104, and the S/D features 120. In some embodiments, some loss of the various features 116, 118, 124, 104, and 120 during the etching process is acceptable.

Figure 15:
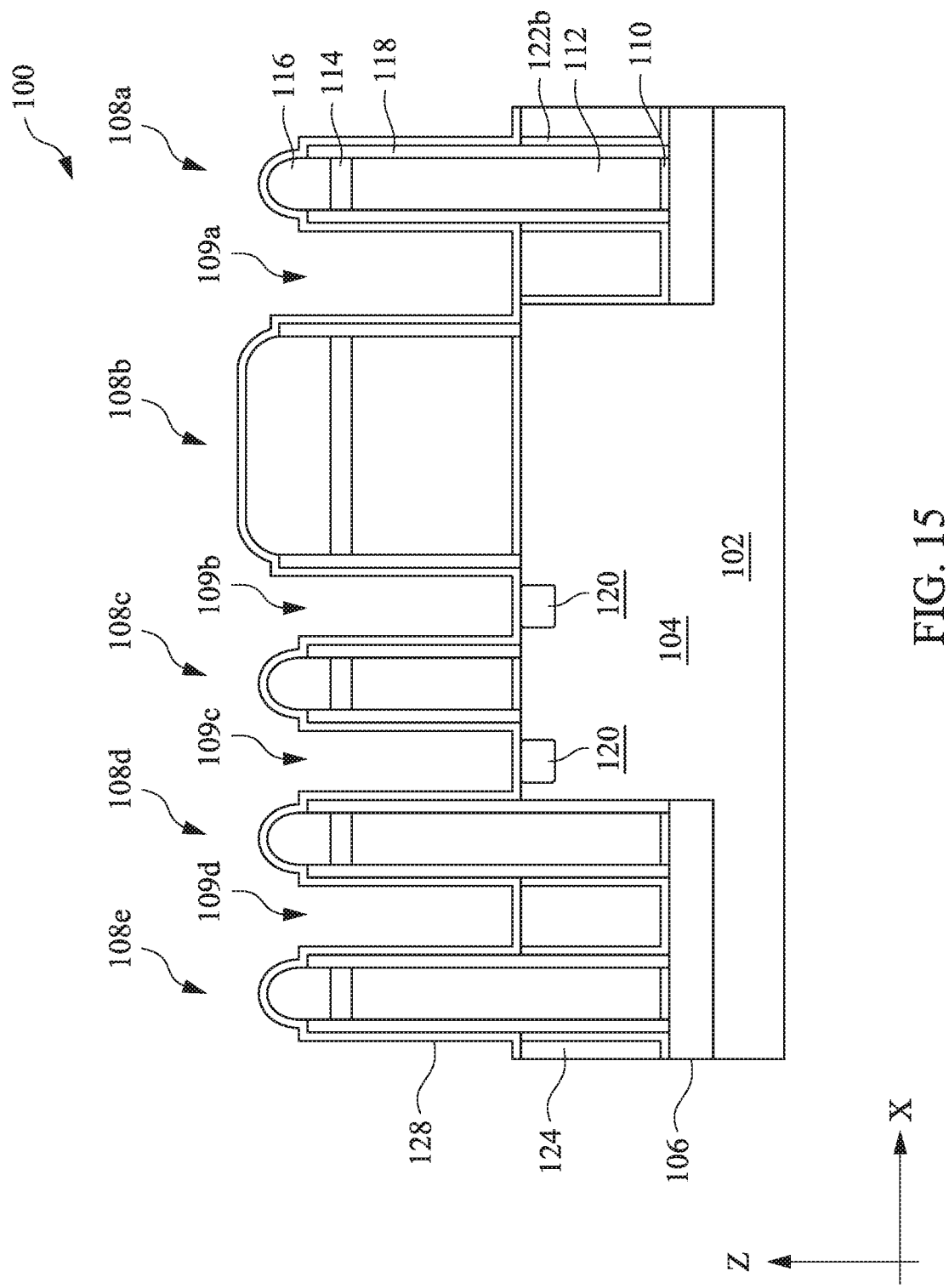

At operation 20, the method 10 (FIG. 1D) forms a CESL 128 over the gate structures 108a-e, the fins 104, the S/D features 120, the CESL 122, and the ILD layer 124, as shown in FIG. 15. Other aspects of the operation 20 have been described above with reference to FIG. 8.

Figure 16:
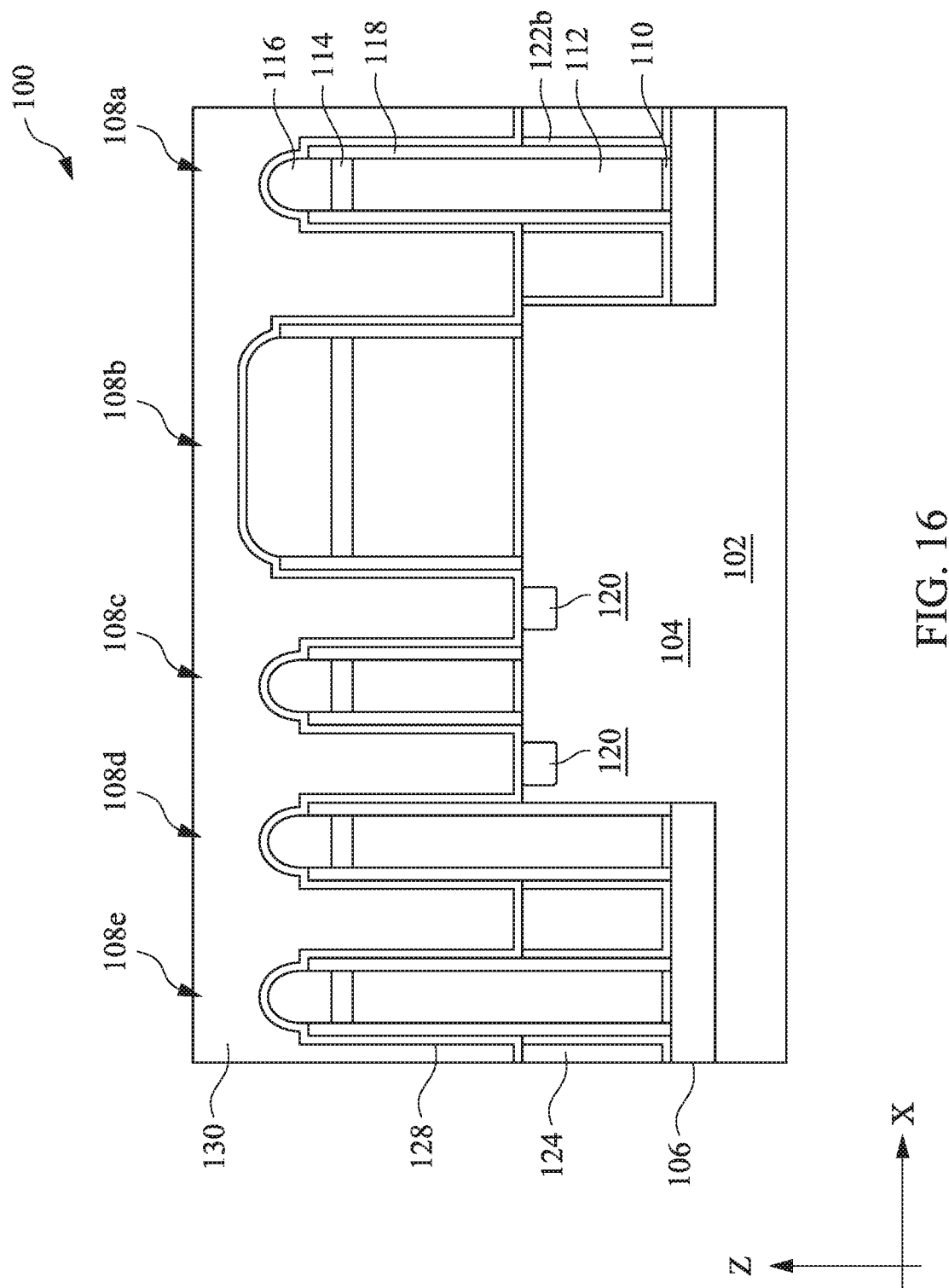

At operation 22, the method 10 (FIG. 1D) deposits an ILD layer 130 over the CESL 128 and filling the trenches 109a-d (FIG. 15), as shown in FIG. 16. Other aspects of the operation 22 have been described above with reference to FIG. 9.

Figure 17:
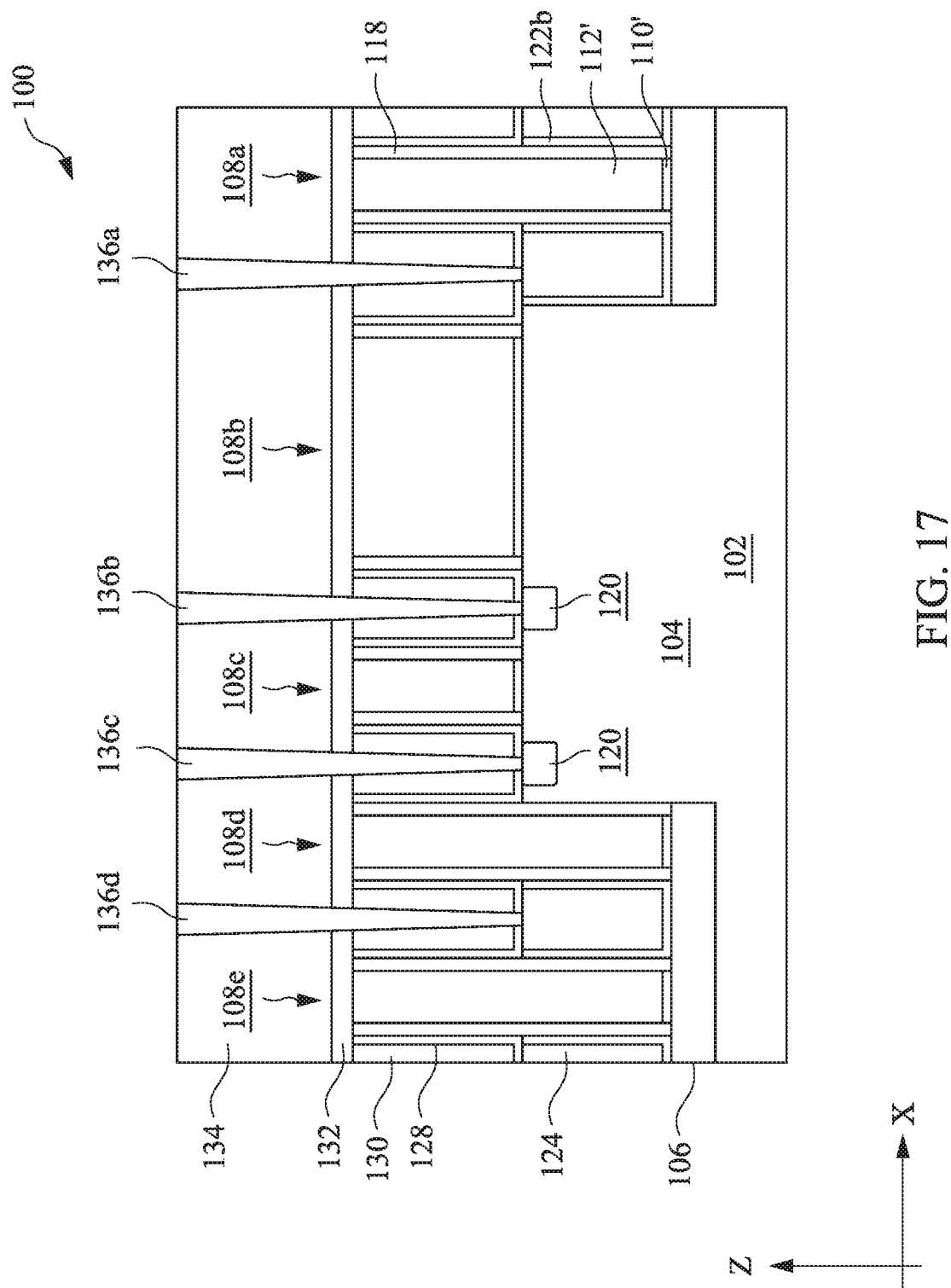

At operation 24, the method 10 (FIG. 1D) forms contact features 136a, 136b, 136c, and 136d reaching into the second ILD layer 130, as shown in FIG. 17. Referring to FIG. 17, the contact features 136a-d penetrate the ILD layer 134, the CESL 132, the ILD layer 130, and the CESL 128. Above the fins 104, the contact features 136b-c electrically contact the S/D features 120. Above the isolation structure 106, the contact features 136a and 136d come in contact with the ILD layer 124 in this embodiment. Other aspects of the operation 24 have been discussed with reference to FIG. 10.

Although not intended to be limiting, one or more embodiments of the present disclosure provide many benefits to a semiconductor device and a formation process thereof. For example, embodiments of the present disclosure form contact features having about the same depth (and height) above a fin and above an isolation structure even though the fin and the isolation structure are of different heights. As a result, these contact features do not suffer from tilting and bending defects as much as those contact features with substantially different heights. Furthermore, embodiments of the present disclosure reduce the aspect ratio of trenches situated above an isolation structure, which effectively reduces the likelihood of having voids at the bottom of the trenches after contact formation. Still further, embodiments of the present disclosure can be readily integrated into existing semiconductor fabrication processes.

In one exemplary aspect, the present disclosure is directed to a method for semiconductor fabrication. The method includes providing a device structure having an isolation structure, a fin adjacent the isolation structure and taller than the isolation structure, and gate structures over the fin and the isolation structure, wherein the isolation structure, the fin, and the gate structures define a first trench over the fin and a second trench over the isolation structure. The method further includes forming a first contact etch stop layer (CESL) over the gate structures, the fin, and the isolation structure; depositing a first inter-layer dielectric (ILD) layer over the first CESL and filling in the first and second trenches; and recessing the first ILD layer such that the first ILD layer in the first trench is removed and the first ILD layer in the second trench is recessed to a level that is about even with a top surface of the fin.

In an embodiment of the method, the first CESL is thicker on top of the gate structures than on sidewalls of the gate structures. In an embodiment, the method further includes forming a second CESL over the first CESL in the first trench and over the first CESL and the first ILD layer in the second trench after the recessing of the first ILD layer; and depositing a second ILD layer over the second CESL and filling in remaining spaces of the first and second trenches. In a further embodiment, the method includes forming a first contact feature reaching into the second ILD layer in the first trench and a second contact feature reaching into the second ILD layer in the second trench. In an embodiment of the method, the second CESL is conformal.

In an embodiment, the forming of the first CESL includes depositing a conformal layer comprising a dielectric material over the gate structures, the fin, and the isolation structure; treating the conformal layer with a plasma such that first portions of the conformal layer on the top of the gate structures receive more plasma treatment than second portions of the conformal layer on the sidewalls of the gate structures; and applying a chemical solution to the conformal layer that dissolves the second portions faster than the first portions. In a further embodiment, the dielectric material includes silicon nitride, the plasma uses argon gas or nitrogen gas, and the chemical solution includes dilute hydrofluoric acid (DHF).

In an embodiment, the method further includes, after the recessing of the first ILD layer, recessing the first CESL such that it is removed from the first trench, and removed from the second trench above the first ILD layer. In a further embodiment, the method includes forming a second CESL on sidewalls of the first and second trenches after the recessing of the first CESL, and depositing a second ILD layer over the second CESL and filling in remaining spaces of the first and second trenches. Further, the method may include forming a first contact feature reaching into the second ILD layer in the first trench and a second contact feature reaching into the second ILD layer in the second trench.

In another exemplary aspect, the present disclosure is directed to a method for semiconductor fabrication. The method includes providing a device structure having a substrate; a fin extending from the substrate; an isolation structure over the substrate, adjacent the fin, and lower than the fin; and gate structures over the fin and the isolation structure. The fin, the isolation structure, and the gate structures define a first trench over the fin and a second trench over the isolation structure. The method further includes forming a first contact etch stop layer (CESL) over the gate structures, the fin, and the isolation structure, wherein the first CESL is thicker on top of the gate structures than on sidewalls of the gate structures. The method further includes depositing a first inter-layer dielectric (ILD) layer over the first CESL and filling in the first and second trenches; and recessing the first ILD layer such that the first ILD layer in the first trench is removed and the first ILD layer in the second trench is recessed to about as low as a top surface of the fin.

In an embodiment, the method further includes, after the recessing of the first ILD layer, forming a second CESL over the first CESL in the first trench and over the first CESL and the first ILD layer in the second trench. The second CESL is conformal. The method further includes depositing a second ILD layer over the second CESL and filling in remaining spaces of the first and second trenches. In a further embodiment, the method includes forming a first contact feature that penetrates the second CESL in the first trench and a second contact feature that penetrates the second CESL in the second trench.

In an embodiment of the method, the forming of the first CESL includes depositing a conformal layer comprising silicon nitride over the gate structures, the fin, and the isolation structure; treating the conformal layer with a plasma such that first portions of the conformal layer on the top of the gate structures receive more plasma treatment than second portions of the conformal layer on the sidewalls of the gate structures; and applying a chemical solution comprising hydrofluoric acid to the conformal layer that dissolves the second portions faster than the first portions.

In yet another exemplary aspect, the present disclosure is directed to a method for semiconductor fabrication. The method includes providing a device structure having an isolation structure, a fin laterally abutting the isolation structure and taller than the isolation structure, and gate structures over the fin and the isolation structure. The isolation structure, the fin, and the gate structures define a first trench over the fin and a second trench over the isolation structure. The method further includes depositing a first contact etch stop layer (CESL) over the gate structures, the fin, and the isolation structure; depositing a first inter-layer dielectric (ILD) layer over the first CESL and filling in the first and second trenches; recessing the first ILD layer such that the first ILD layer in the first trench is removed and the first ILD layer in the second trench is recessed to about a same level as a top surface of the fin; and recessing the first CESL such that it is removed from the first trench, and removed from the second trench above the first ILD layer.

In an embodiment, the method further includes depositing a second CESL over sidewalls of the first and second trenches. In an embodiment, the first CESL is conformal and the second CESL is conformal. In a further embodiment, the method includes depositing a second ILD layer over the second CESL and forming two contact features that penetrate the second ILD layer in the first and second trenches respectively.

In another exemplary aspect, the present disclosure is directed to a semiconductor device. The semiconductor device includes an isolation structure; a fin adjacent the isolation structure and taller than the isolation structure; gate structures over the isolation structure and the fin, defining a first space between a first pair of adjacent sidewalls of the gate structures and a top surface of the fin, and defining a second space between a second pair of adjacent sidewalls of the gate structures and a top surface of the isolation structure; a first dielectric layer on the second pair of adjacent sidewalls and the top surface of the isolation structure; a second dielectric layer over the first dielectric layer and filling in a lower portion of the second space, wherein the first and second dielectric layers comprise different materials; a first contact feature over the top surface of the fin and between the first pair of adjacent sidewalls; and a second contact feature over the top surface of the second dielectric layer and between the second pair of adjacent sidewalls, wherein the top surface of the fin is at about a same level as the top surface of the second dielectric layer.

In an embodiment, the semiconductor device further includes a third dielectric layer over the first pair of adjacent sidewalls and over portions of the second pair of adjacent sidewalls that are above the second dielectric layer. In an embodiment, the first dielectric layer is also disposed between the third dielectric layer and each of the first pair of adjacent sidewalls. In another embodiment the first dielectric layer is also disposed between the third dielectric layer and each of the second pair of adjacent sidewalls.

In yet another exemplary aspect, the present disclosure is directed to a semiconductor device. The semiconductor device includes an isolation structure; a fin adjacent the isolation structure; gate structures over the isolation structure and the fin; a first dielectric layer over a top surface of the isolation structure, a top surface of the fin, and sidewalls of the gate structures; a second dielectric layer over a portion of the first dielectric layer that is directly above the isolation structure, wherein the first and second dielectric layers include different materials; a third dielectric layer in physical contact with another portion of the first dielectric layer directly above the fin, in physical contact with the fin, and in physical contact with the first and second dielectric layers directly above the isolation structure; and a fourth dielectric layer over the third dielectric layer.

In an embodiment, the semiconductor device further includes a first conductive feature over the top surface of the fin and penetrating through the first, third, and fourth dielectric layers; and a second conductive feature over the top surface of the isolation structure and penetrating the third and fourth dielectric layers but not the second dielectric layer. The semiconductor device may further include a source/drain feature in physical contact with the first conductive feature.

In yet another exemplary aspect, the present disclosure is directed to a semiconductor device. The semiconductor device includes an isolation structure; a fin adjacent the isolation structure; gate structures over the isolation structure and the fin; a first dielectric layer over a top surface of the isolation structure and on sidewalls of the gate structures that are directly above the isolation structure; a second dielectric layer over the first dielectric layer; a third dielectric layer in physical contact with sidewalls of the gate structures, in physical contact with the fin, and in physical contact with the second dielectric layer, wherein the second dielectric layer includes a material different than materials included in the first and third dielectric layers; and a fourth dielectric layer over the third dielectric layer.

In some embodiments, the semiconductor device further includes a first conductive feature over the fin and penetrating the third and fourth dielectric layers; and a second conductive feature over the second dielectric layer and penetrating the third and fourth dielectric layers. In some embodiments of the semiconductor device, a top surface of the second dielectric layer is below a top surface of the fin.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor fabrication, the method comprising:
providing a device structure having an isolation structure, a fin laterally abutting the isolation structure and taller than the isolation structure, gate structures over the fin and the isolation structure, wherein the isolation structure, the fin, and the gate structures define a first trench directly over the fin and a second trench directly over the isolation structure;
depositing a first contact etch stop layer (CESL) over the gate structures, the fin, and the isolation structure;
depositing a first inter-layer dielectric (ILD) layer over the first CESL and filling in the first and second trenches;
recessing the first ILD layer such that the first ILD layer in the first trench is removed and the first ILD layer in the second trench is recessed and a portion of the first ILD layer remains in the second trench;
recessing the first CESL such that it is removed from the first trench, and removed from the second trench above the portion of the first ILD layer; and
depositing a second CESL over sidewalls of the first and second trenches.

2. The method of claim 1, wherein the first ILD layer is deposited using at least one material selected from the group consisting of: tetraethylorthosilicate (TEOS) oxide, un-doped silicate glass, borophosphosilicate glass (BPSG), fused silica glass (FSG), phosphosilicate glass (PSG), boron doped silicon glass (BSG), and a low-k dielectric material.

3. The method of claim 1, further comprising:
depositing a second ILD layer over the second CESL and filling in remaining spaces of the first and second trenches.

4. The method of claim 3, further comprising:
forming a first contact feature reaching into the second ILD layer in the first trench and a second contact feature reaching into the second ILD layer in the second trench.

5. The method of claim 1, wherein the first CESL includes silicon nitride.

6. A method comprising:
receiving a device that includes:
a substrate;
an isolation structure disposed on the substrate;
a fin extending from the substrate through the isolation structure; and
a set of gate structures disposed on the isolation structure;
forming a first etch stop layer on the isolation structure and on the set of gate structures;
forming a first inter-layer dielectric (ILD) layer on the first etch stop layer between the set of gate structures;
recessing the first ILD layer to form a recessed first ILD layer, wherein a top surface of the recessed first ILD layer is even with a top surface of the fin or below the top surface of the fin;
recessing the first etch stop layer such that a top surface of the first etch stop layer is below a top surface of the set of gate structures;
forming a second etch stop layer on the recessed first ILD layer and on the fin;
forming a second ILD layer on the second etch stop layer; and
recessing the second ILD layer to be at a same level over the fin and over the isolation structure, wherein the recessing of the second ILD layer includes planarizing the set of gate structures such that a top surface of each of the set of gate structures is at a same level as a top of the recessed second ILD layer.

7. The method of claim 6, wherein:
the set of gate structures is a first set of gate structures;
the device further includes a second set of gate structures disposed on the fin;
the forming of the first etch stop layer forms the first etch stop layer on the second set of gate structures and on the fin; and
the method further comprises removing the first etch stop layer from the second set of gate structures and from the fin.

8. The method of claim 6, wherein the top surface of the first etch stop layer is at a level even with the top surface of the first ILD layer.

9. The method of claim 6, further comprising:
forming a first contact that extends through the second ILD layer and the second etch stop layer to couple to a source/drain feature of the fin; and forming a second contact that extends through the second ILD layer and the second etch stop layer to the first ILD layer.

10. A method, comprising:
providing a structure having a substrate, an isolation structure over the substrate, a fin extending from the substrate and above the isolation structure, gate structures over the fin and the isolation structure, wherein the isolation structure, the fin, and the gate structures define a first trench directly over the fin and a second trench directly over the isolation structure;
depositing a first etch stop layer over the gate structures, the fin, and the isolation structure;
depositing a first inter-layer dielectric (ILD) layer over the first etch stop layer and filling in the first and second trenches;
recessing the first ILD layer such that the first ILD layer in the first trench is completely removed and the first ILD layer in the second trench partially remains; and
recessing the first etch stop layer such that it is removed from the first trench and removed from the second trench above the remained first ILD layer.

11. The method of claim 10, further comprising:
depositing a second etch stop layer over sidewalls of the first and second trenches.

12. The method of claim 11, further comprising:
forming a second ILD layer over the second etch stop layer.

13. The method of claim 12, further comprising:
forming a contact that extends through the second ILD layer and the second etch stop layer to electrically connect to a source/drain feature of the fin.

14. The method of claim 10, wherein the gate structures includes a first gate structure, and
wherein the first etch stop layer includes a first portion disposed on a top surface of the first gate structure and a second portion disposed on a sidewall surface of the first gate structure after depositing the first etch stop layer over the gate structures, the fin, and the isolation structure, wherein the first portion of the first etch stop layer has the same thickness as the second portion of the first etch stop layer.

15. The method of claim 1, wherein the gate structures includes a first gate structure, and
wherein the first contact etch stop layer includes a first portion disposed on a top surface of the first gate structure and a second portion disposed on a sidewall surface of the first gate structure after depositing the first contact etch stop layer over the gate structures, the fin, and the isolation structure, wherein the first portion of the first contact etch stop layer has the same thickness as the second portion of the first contact etch stop layer.

* * * * *